United States Patent
Okada

(10) Patent No.: US 6,525,544 B1
(45) Date of Patent: Feb. 25, 2003

(54) METHOD FOR PREDICTING LIFETIME OF INSULATING FILM AND METHOD FOR RELIABILITY TESTING OF SEMICONDUCTOR DEVICE

(75) Inventor: Kenji Okada, Toyonaki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/762,951

(22) PCT Filed: Jun. 15, 2000

(86) PCT No.: PCT/JP00/03871

§ 371 (c)(1),
(2), (4) Date: Feb. 15, 2001

(87) PCT Pub. No.: WO00/77845

PCT Pub. Date: Dec. 21, 2000

(30) Foreign Application Priority Data

Jun. 15, 1999 (JP) .............................. 11-167824

(51) Int. Cl.[7] .................. H01H 31/12; G01R 31/26; H01L 21/00
(52) U.S. Cl. .................. 324/551; 324/765; 438/151
(58) Field of Search .................. 324/551, 765, 324/766, 537, 544; 438/149, 151, 152

(56) References Cited

U.S. PATENT DOCUMENTS

| | | | | |
|---|---|---|---|---|
| 5,904,490 | A | * 5/1999 | Tabara | 324/765 |
| 6,249,139 | B1 | * 6/2001 | Fu et al. | 324/520 |
| 6,326,792 | B1 | * 12/2001 | Okada | 324/456 |

FOREIGN PATENT DOCUMENTS

| JP | 9-326429 | 12/1997 |
|---|---|---|
| JP | 11-186351 | 7/1999 |

OTHER PUBLICATIONS

Chen et al., "Electrical Breakdown in Thin Gate and Tunneling Oxides", IEEE Transactions on Electron Devices, vol. ED–32, No. 2, Feb. 1985, pp. 413–422.

Lee et al., "Modeling and Characterizing of Gate Oxide Reliability", IEEE Transactions on Electron Devices, vol. 35, No. 12, Dec. 1988, pp. 2268–2278.

McPherson et al., "Acceleration Factors for Thin Gate Oxide Stressing", IEEE Int. Rel. Phys. Symposium, 1985, pp. 1–5.

McPherson et al., "Underlying Physics of the Thermochemical E Model in Describing Low–Field Time–Dependent Dielectric Breakdown in $SiO_2$ Thin Films", Journal of Applied Physics, vol. 84, No. 3, Aug. 1, 1998, pp. 1513–1523.

International Search Report dated Sep. 19, 2000.

* cited by examiner

Primary Examiner—N. Le
Assistant Examiner—James Kerveros
(74) Attorney, Agent, or Firm—Nixon Peabody LLP; Thomas W. Cole

(57) ABSTRACT

A total injected electron quantity $Q_{BD}$, which has reached a constant value against a variation in stress voltage applied to an insulating film for use in a semiconductor device, is obtained as a critical injected electron quantity $Q_{BDcrit}$. The total injected electron quantity $Q_{BD}$ is a total quantity of electrons injected into the insulating film before the film causes a dielectric breakdown. Thereafter, a time it should take for a total quantity of electrons, injected into the insulating film under actual operating conditions of the device, to reach the critical injected electron quantity $Q_{BDcrit}$ is estimated as the expected lifetime of the insulating film.

16 Claims, 12 Drawing Sheets

($T_{BD}$=2000[sec], $T_{Asat}$=18[sec], $T_{FNsat}$=85[sec])

stress electric field E$_{OX}$
[arbitrary unit]

stress electric field E$_{OX}$
[arbitrary unit]

METHOD FOR PREDICTING LIFETIME OF INSULATING FILM AND METHOD FOR RELIABILITY TESTING OF SEMICONDUCTOR DEVICE

TECHNICAL FIELD

The present invention relates to a method for predicting the lifetime of an insulating film for use in a semiconductor device and to a method for reliability testing of the device by utilizing the lifetime prediction method.

BACKGROUND ART

Hereinafter, a known lifetime prediction method for an insulating film will be described as being applied to the lifetime prediction of a gate insulating film for a MOSFET.

It should be noted that when a voltage or current value is preceded by a negative sign, that notation herein means that the potential level is lower at the gate electrode than at the substrate. Also, the "dielectric breakdown" herein means a steep rise of leakage current resulting from stressing, i.e., the generation of a hard breakdown (HBD), for a relatively thick insulating film, but means the generation of a soft breakdown (SBD) for a relatively thin insulating film. For a relatively thin insulating film, however, even if the SBD and HBD have occurred there at a time, it is supposed that only the SBD has occurred there.

First, an accelerating voltage (e.g., with an absolute value of 6 V), higher than an actual operating voltage normally applied (e.g., with an absolute value of 1.5 V), is applied to the gate electrode of a MOSFET under test, and a current flowing through its gate insulating film is measured. In this manner, a time it takes for the gate insulating film to cause a dielectric breakdown, i.e., the lifetime of the insulating film, is estimated (i.e., an accelerated test is performed). In this case, as the accelerating voltage is set even higher than the actual operating voltage, the insulating film lifetime, expected by the accelerated test, becomes even shorter than the lifetime of the insulating film under actual operating conditions.

Next, into a relationship between the voltage or electric field applied to the gate insulating film and the insulating film lifetime, i.e., a voltage-lifetime model (that should be made beforehand), the insulating film lifetime, expected by the accelerated test, is extrapolated. In this manner, the insulating film lifetime under actual operating conditions is calculated.

First Problem

Hereinafter, a first problem of the known lifetime prediction method for an insulating film will be described.

In the known lifetime prediction method, a time it takes for the insulating film to cause a dielectric breakdown should be actually measured at an accelerated test. Thus, it takes a long time to predict the lifetime of the insulating film. However, if the difference between the accelerating and actual operating voltages is increased to shorten the time for predicting the insulating film lifetime, then the expected lifetime of the insulating film will have its accuracy decreased because the voltage-lifetime model becomes less reliable. Nevertheless, if the accelerated test is performed a great number of times with the accelerating voltage set closer to the actual operating voltage to predict the lifetime of the insulating film more accurately, then it takes an even longer time to predict the lifetime of the insulating film.

Premise of Second Problem

As described above, in predicting the lifetime of an insulating film, an accurate voltage-lifetime model should be prepared.

Hereinafter, "1/E" and "E" models will be described as typical known voltage-lifetime models.

FIG. 12 illustrates a relationship between a stress voltage applied to the gate insulating film of an n-channel MOSFET and a total injected electron quantity $Q_{BD}$, i.e., a total quantity of electrons injected into the gate insulating film before the dielectric breakdown occurs there. FIG. 12 also illustrates a relationship between the stress voltage and a total injected hole quantity $Q_P$, i.e., a total quantity of holes injected into the gate insulating film before the dielectric breakdown occurs there. In this case, the thickness of the gate insulating film is 5 nm and the gate length and width are both 100 μm. That is to say, the area of the gate insulating film is 0.01 mm². In FIG. 12, the total injected electron and holes quantities $Q_{BD}$ and $Q_P$ are indicated by open and solid circles, respectively.

As shown in FIG. 12, the higher the stress voltage, the smaller the total injected electron quantity $Q_{BD}$. On the other hand, the total injected hole quantity $Q_P$ is constant irrespective of the stress voltage. That the total injected hole quantity $Q_P$ becomes constant, i.e., anode hole injection model, was already reported by C. Hu et al. See I. C. Chen, S. E. Holland and C. Hu: IEEE Trans. Elec. Dev. 32 (1985) p. 413 and J. C. Lee, I. C. Chen and C. Hu: IEEE Trans. Elec. Dev. 35 (1988) p. 2268, for example.

It should be noted that when I say "constant" herein, this term also implies "substantially constant".

According to the anode hole injection model, the dielectric breakdown is believed to occur in the following manner. First, electrons, which have been injected from the cathode (e.g., gate electrode) into the gate insulating film due to stressing, create holes in the anode (e.g., substrate). Then, the holes created are injected back into the gate insulating film, thereby producing defects in the gate insulating film and eventually causing the dielectric breakdown there. In this case, the total injected hole quantity $Q_P$ is believed to be constant until the dielectric breakdown occurs in the gate insulating film. The probability that the holes are created in the anode by the electrons and then injected into the gate insulating film is generally called a "quantum efficiency γ", which greatly depends on the stress voltage. Thus, since a relationship $Q_P = \gamma \times Q_{BD}$ is met, the total injected electron quantity $Q_{BD}$ changes with the quantum efficiency γ.

It is known that the lifetime $T_{BD}$ of the gate insulating film, predicted after the anode hole injection model, is exponentially proportional to the inverse of a stress electric field $E_{OX}$ (i.e., an electric field actually formed in the film due to the application of the stress voltage). For that reason, the anode hole injection model is also called a "1/E" model. The stress electric field $E_{OX}$ is given by:

$E_{OX}$=(fraction of stress voltage applied to gate insulating film)÷(thickness of gate insulating film)

As opposed to the "1/E" model, the "E" model (see, e.g., J. W. McPherson and D. A. Baglee: Int. Rel. Phys. Symposium (1985) p. 1) supposes that the stress electric field $E_{OX}$ itself degrades the gate insulating film and finally causes the dielectric breakdown there. See also J. W. McPherson and H. C. Mogul: J. Appl. Phys. 84 (1998) pp. 1513–1523.

FIG. 13 illustrates a relationship between the stress electric field $E_{OX}$ formed in the gate insulating film and the lifetime $T_{BD}$ of the film predicted after the "1/E" model and a relationship between the stress electric field $E_{OX}$ and the lifetime $T_{BD}$ predicted after the "E" model. The data illustrated in FIG. 13, i.e., the lifetimes $T_{BD}$ of the gate insulating film predicted after the "1/E" and "E" models, was collected from the same gate insulating film as that used for FIG. 12. And the predicted lifetimes of those films were fitted to each other, i.e., almost equal to each other at a stress electric field $E_{OX}$ in the range from 11 to 13 MV/cm.

As shown in FIG. 13, the lifetime $T_{BD}$ of the gate insulating film as predicted after the "1/E" model (see the dashed line) increases exponentially even in the semilogarithmic plot as the stress electric field $E_{OX}$ decreases. But the lifetime $T_{BD}$ of the gate insulating film as predicted after the "E" model (see the solid line) shows a negative proportionality for the stress electric field $E_{OX}$ (in the semilogarithmic plot).

Second Problem

Hereinafter, a second problem of the known method for predicting the lifetime of an insulating film after the "1/E" or "E" model, for example, will be described.

It has been impossible to definitely decide which should be regarded as the more appropriate voltage-lifetime model, "1/E" or "E". This is partly because if the difference between the insulating film lifetimes predicted after these models is to be actually recognized, then the insulating film lifetimes should be measured for stress electric fields in a very wide range.

Specifically, suppose the lifetime $T_{BD}$ of a gate insulating film is actually measured for a stress electric field $E_{OX}$ in the range from 11 to 13 MV/cm. And then the lifetime $T_{BD}$ for a stress electric field $E_{OX}$ of less than 11 MV/cm is predicted by applying the "1/E" and "E" models shown in FIG. 13 to the lifetime $T_{BD}$ actually measured. In that case, no significant difference is recognizable between the lifetimes $T_{BD}$ predicted on these models until the stress electric field $E_{OX}$ is about 9 Mv/cm or less.

Accordingly, to know which is more appropriate, "1/E" or "E", the lifetime $T_{BD}$ of the gate insulating film should be actually measured for stress electric fields $E_{OX}$ in the range from 9 through 13 MV/cm. However, a lifetime $T_{BD}$, corresponding to an electric field intensity in such a wide range, is changeable over six orders of magnitude or more. Also, a dielectric breakdown time, i.e., time to breakdown, or time it takes for the gate insulating film to cause a dielectric breakdown, is also variable over a wide range. Accordingly, the lifetime $T_{BD}$ should be predicted by measuring the dielectric breakdown times of a great number of sample gate insulating films and by processing the results of measurement statistically. In that case, to reduce the adverse effects of that variation, the lifetimes $T_{BD}$ should be actually measured for electric field intensities in an even broader range.

However, it is difficult to accurately measure the insulating film lifetime that is changeable over six orders of magnitude or more. For that reason, no one could ever definitely decide which is more appropriate, "1/E" or "E". As a result, the lifetime of an insulating film under actual operating conditions of a semiconductor device, i.e., the lifetime of an insulating film in which a weak electric field has been formed, could not be predicted reliably.

DISCLOSURE OF INVENTION

Objects of the Present Invention

In view of these respects, a first object of the present invention is to predict the lifetime of an insulating film in a short time, and a second object thereof is to accurately predict the lifetime of an insulating film under actual operating conditions of a semiconductor device.

Principle of Solution for Achieving the First Object

To achieve the first object, or to solve the first problem, the present inventor carried out the following research.

First, a MOSFET, in which a gate insulating film and a gate electrode were formed out of a silicon dioxide film and a polysilicon film, respectively, on a p-type silicon substrate, is prepared. In this case, the thickness of the gate insulating film is 6.0 nm and the area of the gate insulating film is 0.01 mm$^2$, for example.

Next, a constant voltage of −6.0 V is applied as a stress voltage to the gate electrode of the MOSFET (which will be herein called a "MOSFET under test"). Thereafter, every time a time interval T has passed, the application of the stress voltage is once suspended, a gate voltage $V_G$ (e.g., −4.5 V) is applied to the gate electrode and then a gate current $I_G$, flowing through the gate insulating film, is measured. The resultant relationships between the gate voltage $V_G$ and gate current $I_G$, or I–V characteristics, are shown in FIG. 1. In FIG. 1, the I–V characteristics, corresponding to respective time intervals of 0, 1, 10, 100 and 1,000 seconds (which appear on the log scales at regular intervals), are illustrated.

As shown in FIG. 1, while the gate voltage $V_G$ is within a predetermined range, the longer the time interval T (i.e., as the stressing time passes), the larger the gate current $I_G$. Specifically, suppose the gate voltage $V_G$ is equal to the stress voltage (i.e., −6.0 V), for example. In that case, the gate current $I_G$ at the time of dielectric breakdown (corresponding to T=1,000 in the example illustrated in FIG. 1) is just several time greater than that at the initial stage of stressing (corresponding to T=0). On the other hand, if the gate voltage $V_G$ is −4.5 V, for example, the gate current $I_G$ gradually increases with the passage of the stressing time. In the end, the gate current $I_G$ will have changed approximately by several orders of magnitude. Such a current, of which a considerable increase is observable between the initial stage of stressing and the time of dielectric breakdown, is called an A-mode SILC current (A-mode stress induced leakage current). In the example illustrated in FIG. 1, a gate current $I_G$, corresponding to a gate voltage $V_G$ in the range from about −3 to about −5.5 V, is the A-mode SILC current.

FIG. 2 illustrates a relationship between the A-mode SILC current $I_A$ (for $V_G$=−4.5 V) shown in FIG. 1 and the stressing time $T_S$ (see the dashed line).

That is to say, the A-mode SILC current $I_A$ shown in FIG. 2 is measured in the following manner. First, a constant voltage stress of −6.0 V is applied to the gate electrode of a MOSFET under test. Thereafter, every time a predetermined time interval has passed, the stressing is once suspended, a gate voltage $V_G$ of −4.5 V is applied to the gate electrode and then the A-mode SILC current $I_A$ flowing through the gate insulating film is measured. In this case, the intensity of the stress electric field $E_{OX}$ formed in the gate insulating film is about 12.0 MV/cm.

FIG. 2 also illustrates a relationship between a gate current $I_G$ flowing through the gate insulating film at a gate voltage $V_G$ of −6.0 V, i.e., an FN (Fowler-Nordheim) current $I_{FN}$, and the stressing time $T_{SD}$ (see the solid line). The FN current $I_{FN}$ shown in FIG. 2 is measured in the following manner. First, a constant voltage stress of −6.0 V is applied to the gate electrode of a MOSFET under test. Then, every time a predetermined time interval has passed, the FN current $I_{FN}$, flowing through the gate insulating film, is measured. That is to say, in measuring the FN current $I_{FN}$, stressing does not have to be suspended unlike the measurement of the A-mode SILC current $I_A$ because the stress voltage is equal to the gate voltage $V_G$ at −6.0 V.

As shown in FIG. 2, as the stressing time $T_{SD}$ passes, the A-mode SILC current $I_A$ increases. However, in FIG. 2 (i.e., in a double logarithmic plot with the abscissa $T_{SD}$ and the ordinate $I_A$), the slope of the time dependent variation of the A-mode SILC current $I_A$ starts to decline when the stressing time $T_{SD}$ reaches a polarity change time $T_{Asat}$ (i.e., when $T_{Asat}$=18 seconds in the example illustrated in FIG. 2).

As also shown in FIG. 2, the FN current $I_{FN}$ goes on increasing with the passage of the stressing time $T_S$ until the stressing time $T_S$ reaches a saturation time $T_{FNsat}$ (i.e., $T_{FNsat}$=85 seconds in the example illustrated in FIG. 2). However, once the stressing time $T_S$ exceeds the saturation time $T_{FNsat}$, the FN current $I_{FN}$ decreases with the passage of the stressing time $T_S$. In other words, the FN current $I_{FN}$ reaches its maximum value when the stressing time $T_S$ is the saturation time $T_{FNsat}$.

As also shown in FIG. 2, when the stressing time $T_S$ reaches a dielectric breakdown time $T_{BD}$ (i.e., $T_{BD}$=2,000 seconds in the example shown in FIG. 2), a dielectric breakdown occurs in the gate insulating film of the MOSFET under test.

FIG. 3 illustrates relationships between the A-mode SILC current $I_A$ (for $V_G$=−4.0 V) flowing through the gate insulating film and the stressing time $T_{BD}$ where various stress voltages are applied to the MOSFET under test (i.e., the gate electrode is at the lower potential level). That is to say, the relationships illustrated in FIG. 3 correspond to stress electric fields $E_{OX}$ of various intensities that have been formed in the gate insulating film of the MOSFET under test.

In FIG. 3, the variations of the A-mode SILC currents $I_A$, corresponding to the respective stress electric fields $E_{OX}$, with the passage of the stressing time $T_S$ are represented by open circles and dashed lines. The values of the A-mode SILC currents $I_A$ when the stressing times $T_S$ reach the respective polarity change times $T_{Asat}$ are indicated by solid squares. And the values of the A-mode SILC currents $I_A$ when the stressing times $T_S$ reach the respective dielectric breakdown times $T_{BD}$ are indicated by solid circles. However, if the stress electric field $E_{OX}$ (or the stress voltage) is small, then the amount of the A-mode SILC current $I_A$ is also small. As a result, current components other than the A-mode SILC current $I_A$, which exist on the background, are dominating, and therefore, the behavior of the A-mode SILC current $I_A$ is not clear.

As shown in FIG. 3, there is a correspondence between the polarity change time Teat and the dielectric breakdown time $T_{BD}$ for each stress electric field $E_{OX}$.

Although not shown, there is also a similar correspondence between the saturation time $T_{FNsat}$ and the dielectric breakdown time $T_{BD}$ for each stress electric field $E_{OX}$.

FIG. 4 illustrates relationships between the stress electric field $E_{OX}$ and the polarity change time $T_{Asat}$, saturation time $T_{FNsat}$ or dielectric breakdown time $T_{BD}$ that were obtained from the results shown in FIG. 3, for example. In FIG. 4, the polarity change times $T_{Asat}$, saturation times $T_{FNsat}$ and dielectric breakdown times $T_{BD}$, corresponding to predetermined stress electric fields $E_{OX}$, are indicated by solid circles, solid squares and open circles, respectively.

As shown in FIG. 4, the lines, representing the correlations between the dielectric breakdown time $T_{BD}$, polarity change time $T_{Asat}$ or saturation time $T_{FNsat}$ and the stress electric field $E_{OX}$ (see the dashed, solid and one-dot-chain lines, respectively), are substantially parallel to each other. In this case, if these correlations are plotted without using logarithmic scales for the ordinates (i.e., the times), then the graphs (or curves) representing those correlations will be equally spaced from each other.

Accordingly, by finding the correlation between the polarity change time $T_{Asat}$ or saturation time $T_{FNsat}$ and the stress electric field $E_{OX}$ and obtaining a first dielectric breakdown time $T_{BD}$ for a first stress electric field $E_{OX}$ a second dielectric breakdown time $T_{BD}$ can be estimated for a second stress electric field $E_{OX}$. This method will be herein called a "nondestructive lifetime prediction method". Thus, the "nondestructive lifetime prediction method" makes the dielectric breakdown time $T_{BD}$ estimable by measuring the polarity change time $T_{Asat}$ or saturation time $T_{FNsat}$, which is much shorter than the dielectric breakdown time $T_{BD}$ in practice, without actually measuring the dielectric breakdown time $T_{BD}$ by an accelerated test.

Principle of Solution for Achieving the Second Object

To achieve the second object, i.e., to solve the second problem, the present inventor carried out the following research.

First, a MOSFET, in which a gate insulating film and a gate electrode were formed out of a silicon dioxide film and a polysilicon film, respectively, on a p-type silicon substrate, is prepared. In this case, the thickness of the gate insulating film is 5.0 nm and the area of the gate insulating film is 0.01 mm$^2$, for example.

Next, a stress voltage is applied to the gate electrode of the MOSFET (which will be herein called a "MOSFET under test"). Then, a time that should pass after the stress started to be placed and before the gate insulating film causes a dielectric breakdown, i.e., insulating film lifetime $T_{BD}$, is actually measured.

FIG. 5 illustrates relationships between the insulating film lifetime $T_{BD}$, actually measured using the MOSFET under test, and the stress voltage. In FIG. 5, the insulating film lifetimes $T_{BD}$ actually measured are indicated by solid circles, and the insulating film lifetimes $T_{BD}$, predicted after the "1/E" and "E" models, are represented by the dashed and solid lines, respectively, for reference. It should be noted that the insulating film lifetimes $T_{BD}$, predicted after the "1/E" and "E" models, were fitted so as to match to the actually measured insulating film lifetime $T_{BD}$ best. Also, in predicting the insulating film lifetime $T_{BD}$ on the "1/E" model, the total injected hole quantity $Q_P$ (constant value) shown in FIG. 12 was used.

As shown in FIG. 5, the insulating film lifetime $T_{BD}$ actually measured is closer to the insulating film lifetime $T_{BD}$ predicted after the "E" model than to the insulating film lifetime $T_{BD}$ predicted after the "1/E" model. Specifically, where the stress voltage is about 6 V or less, the "E" model is more accurate than the "1/E" model.

As also shown in FIG. 5, the insulating film lifetime $T_{BD}$ actually measured is shorter than the insulating film lifetime $T_{BD}$ predicted after the "1/E" model, i.e., supposing that the total injected hole quantity $Q_P$ should be constant. This means that as the stress voltage decreases, the total injected hole quantity $Q_P$ decreases in actuality.

Next, the total injected hole and electron quantities $Q_P$ and $Q_{BD}$ are derived from the insulating film lifetime $T_{BD}$ actually measured. Specifically, using the insulating film lifetime $T_{BD}$ actually measured for a predetermined stress voltage and a hole current $I_{sub}$ flowing through the gate insulating film at the predetermined stress voltage, the total injected hole quantity $Q_P$ is obtained by $Q_P=T_{BD} \times I_{sub}$, for example. As for the MOSFET under test, the hole current $I_{sub}$ represents a quantity of holes contained in a substrate current flowing through the gate insulating film per unit time for the predetermined stress voltage. Also, using the insulating film lifetime $T_{BD}$ actually measured for the predetermined stress voltage and an electron current $I_G$ flowing through the gate insulating film at the predetermined stress voltage, the total injected electron quantity $Q_{BD}$ is obtained by $Q_{BD}=T_{BD} \times I_G$, for example. As for the MOSFET under test, the electron current $I_G$ represents a quantity of electrons contained in a gate current flowing through the gate insulating film per unit time for the predetermined stress voltage.

FIG. 6 illustrates relationships between the total injected hole or electron quantity $Q_P$ or $Q_{BD}$, calculated from the (actually measured) insulating film lifetime $T_{BD}$ shown in FIG. 5, and the stress voltage.

As shown in FIG. 6, if the stress voltage is higher than about 6 V (absolute value), then the total injected hole quantity $Q_P$ is constant. Alternatively, if the stress voltage is lower than about 6 V (absolute value), then the quantity $Q_P$ decreases with the fall of the stress voltage.

On the other hand, as also shown in FIG. 6, if the stress voltage is higher than about 6 V (absolute value), then the total injected electron quantity $Q_{BD}$ decreases with the rise of the stress voltage. Alternatively, if the stress voltage is lower than about 6 V (absolute value), then the quantity $Q_{BD}$ is constant.

That is to say, as the stress voltage decreases, the parameter being constant alternates from the total injected hole quantity $Q_P$ into the total injected electron quantity $Q_{BD}$.

Also, in the example illustrated in FIG. 6 (where the area of the gate insulating film, or the gate area, is 0.01 mm$^2$), a total injected hole quantity $Q_P$, which has reached a constant value against the variation in stress voltage, is about $10^{-2}$ C/cm$^2$. This constant value will be herein called a "critical injected hole quantity $Q_{Pcrit}$". And a total injected electron quantity $Q_{BD}$, which has reached a constant value against the variation in stress voltage, is about $10^3$ C/cm$^2$. This constant value will be herein called a "critical injected electron quantity $Q_{BDcrit}$". That is to say, the critical injected electron quantity $Q_{BDcrit}$ is greater than the critical injected hole quantity $Q_{Pcrit}$ approximately by four to five orders of magnitude.

Next, by using only the critical injected electron quantity $Q_{BDcrit}$ corresponding to the total injected electron quantity $Q_{BD}$ obtained from the insulating film lifetime $T_{BD}$ actually measured, a first provisional lifetime $T_{BDe}$ of the gate insulating film is obtained. In other words, the first provisional lifetime $T_{BDe}$ is obtained after an "electron dominating model" that supposes electrons alone should degrade the gate insulating film. In this case, the following Equation $$T_{BDe}=Q_{BDcrit}/I_G \tag{1}$$

where $I_G$ is an electron current flowing through the gate insulating film at the predetermined stress voltage, may be used, for example.

Also, by using only the critical injected hole quantity $Q_{Pcrit}$ corresponding to the total injected hole quantity $Q_P$ obtained from the insulating film lifetime $T_{BD}$ actually measured, a second provisional lifetime $T_{BDh}$ of the gate insulating film is obtained. In other words, the second provisional lifetime $T_{BDh}$ is obtained after a "hole dominating model" that supposes holes alone should degrade the gate insulating film, i.e., after the "1/E" model. In this case, the following Equation $$T_{BDh}=Q_{Pcrit}/I_{sub} \tag{2}$$

where $I_{sub}$ is a hole current flowing through the gate insulating film at the predetermined stress voltage, may be used, for example.

FIG. 7 illustrates relationships between the first or second provisional lifetime $T_{BDe}$ or $T_{BDh}$, obtained from the critical injected electron or hole quantity $Q_{BDcrit}$ or $Q_{Pcrit}$ shown in FIG. 6, respectively, and the stress voltage.

In FIG. 7, the first provisional lifetimes $T_{BDe}$, predicted after the "electron dominating model", are indicated by open circles, while the second provisional lifetimes $T_{BDh}$, predicted after the "hole dominating model", are indicated by open squares. In addition, the insulating film lifetime $T_{BD}$, predicted after the "E" model, is also represented in FIG. 7 by the solid line for reference.

Actually, though, both holes and electrons degrade the gate insulating film. Thus, strictly speaking, the real insulating film lifetime $T_{BD}$ should be predicted by the following Equation (3):

$$1/T_{BD}=1/T_{BDe}+1/T_{BDh} \tag{3}$$

Particularly when the first and second provisional lifetimes $T_{BDe}$ and $T_{BDh}$ are approximately on the same order, i.e., where electrons and holes contribute to the degradation of the gate insulating film to almost the same degrees (i.e., around 5.5 V in FIG. 7), the insulating film lifetime $T_{BD}$ is preferably predicted by Equation (3).

On the other hand, if there is a big difference between the first and second provisional lifetimes $T_{BDe}$ and $T_{BDh}$, then the insulating film lifetime $T_{BD}$ can be approximated by the smaller one (i.e., the shorter lifetime) of the first and second provisional lifetimes $T_{BDe}$ and $T_{BDh}$.

Thus, the results shown in FIG. 7 told me that an appropriate voltage-lifetime model should be as follows. Specifically, where the stress voltage is relatively high, such a model should suppose degradation of the gate insulating film due to holes (i.e., the second provisional lifetime $T_{BDh}$) determines the insulating film lifetime $T_{BD}$. On the other hand, where the stress voltage is relatively low, such a model should suppose degradation of the gate insulating film due to electrons (i.e., the first provisional lifetime $T_{BDe}$) determines the insulating film lifetime $T_{BD}$. That model will be herein called a "DCC (dominant carrier change)" model.

FIG. 8 illustrates a relationship between the insulating film lifetime $T_{BD}$, which has been predicted for the MOSFET under test after the "DCC" model, and the stress voltage (see the solid line). In FIG. 8, relationships between the insulating film lifetime $T_{BD}$, predicted after the "1/E" or "E" model, and the stress voltage are represented by the dashed and one-dot-chain lines, respectively, for reference.

As shown in FIG. 8, where the stress voltage is in the range from 4 to 6 V, the insulating film lifetime $T_{BD}$ predicted after the "DCC" model is shorter than the insulating film lifetime $T_{BD}$ predicted after the "1/E" model.

As also shown in FIG. 8, if the stress voltage is about 4 V or less, the insulating film lifetime $T_{BD}$ predicted after the "DCC" model is longer than the insulating film lifetime $T_{BD}$ predicted after the "E" model. Specifically, at stress voltages of about 4 V or less, as the stress voltage decreases, the insulating film lifetime $T_{BD}$ predicted after the "E" model increases linearly in the semilogarithmic plot. On the other hand, as the stress voltage decreases, the insulating film lifetime $T_{BD}$ predicted after the "DCC" model increases steeply and exponentially even in the semilogarithmic plot.

In recent years, there have been many reports demonstrating the appropriateness of the "E" model empirically. However, I believe that the "E" model has been observed as an accurate one within the time range of the insulating film lifetime actually measured just because where the stress voltage is relatively low, it has been impossible to measure the insulating film lifetime within an actually measurable time range. For example, in FIG. 8, the insulating film lifetime is immeasurable for a stress voltage of about 4 V or less.

Specific Solutions Provided by the Present Invention

A first inventive method for predicting the lifetime of an insulating film was made based on the above-described findings, or by the "nondestructive lifetime prediction method", in particular.

Specifically, the first inventive lifetime prediction method is adapted to predict the lifetime of an insulating film for use in a semiconductor device, in which a time it takes for the insulating film to cause a dielectric breakdown is estimated as an expected lifetime of the insulating film. The method includes the step of finding a correlation between a stress condition imposed on an insulating film under test and a time it takes for the slope of a time dependent variation of an A-mode stress induced leakage current to start to decline in a double logarithmic plot or a correlation between the stress condition and a time it takes for an FN current to start to decrease. The insulating film under test has the same specification as the insulating film. The A-mode stress induced leakage current and the FN current both flow through the insulating film under test. The method further includes the step of actually measuring a first dielectric breakdown time it takes for the insulating film under test to cause the dielectric breakdown with a first stress condition imposed on the insulating film under test. And the method further includes the step of estimating, from the correlation and the first dielectric breakdown time, a second dielectric breakdown time it takes for the insulating film, on which a second stress condition is imposed, to cause the dielectric breakdown.

In the first lifetime prediction method, a correlation between a time it takes for the slope of a time dependent variation of an A-mode stress induced leakage current to start to decline (i.e., the polarity change time $T_{Asat}$) in a double logarithmic plot and a stress condition is found. Or a correlation between a time it takes for an FN current to start to decrease (i.e., the saturation time $T_{FNsat}$) and the stress condition is found. Next, a first dielectric breakdown time is actually measured for an insulating film under test, on which a first stress condition is imposed. Then, by reference to the correlation between the polarity change time $T_{Asat}$ or saturation time $T_{FNsat}$ and the stress condition, a second dielectric breakdown time is estimated from the first dielectric breakdown time for the insulating film on which a second stress condition is imposed. Accordingly, there is no need to actually measure the dielectric breakdown time of the insulating film under test by performing an accelerated test. As a result, the lifetime of the insulating film can be predicted in a shorter time.

Also, according to the first lifetime prediction method, the lifetime of a gate insulating film is predicted by using the polarity change time $T_{Asat}$ or saturation time $T_{FNsat}$ and the dielectric breakdown time that have been obtained by an accelerated test. Thus, compared to the known method using only the dielectric breakdown time obtained by an accelerated test, the lifetime of the gate insulating film can be predicted more accurately.

In the first lifetime prediction method, the stress condition is preferably a stress voltage or a stress electric field.

Then, the correlation between the polarity change time $T_{Asat}$ or saturation time $T_{FNsat}$ and the stress condition can be found just as intended.

In the first lifetime prediction method, the thickness of the insulating film is preferably 10 nm or less.

In such an embodiment, the A-mode stress induced leakage current or FN current can be measured accurately enough.

In t he first lifetime prediction method, the insulating film is preferably a gate insulating film for an MOS device.

In such an embodiment, the lifetime of the gate insulating film can be accurately predicted in a short time.

A second inventive method for predicting the lifetime of an insulating film was made based on the above-described findings, or after the "DCC" model, in particular.

Specifically, the second inventive lifetime prediction method is adapted to predict the lifetime of an insulating film for use in a semiconductor device, in which a time it takes for the insulating film to cause a dielectric breakdown is estimated as an expected lifetime of the insulating film. The method includes a first step of obtaining, as a critical injected electron quantity, a total injected electron quantity that has reached a constant value against a variation in stress voltage applied to the insulating film. The total injected electron quantity is a total quantity of electrons injected into the insulating film before the film causes the breakdown. The method also includes a second step of estimating, as the expected lifetime of the insulating film, a time it should take for a total quantity of electrons, injected into the insulating film under actual operating conditions of the device, to reach the critical injected electron quantity.

In the second lifetime prediction method, a total injected electron quantity (i.e., a total quantity of electrons injected into an insulating film before the film causes a dielectric breakdown) that has reached a constant value against a variation in stress voltage applied to the film is obtained as a critical injected electron quantity. Then, a time it should take for a total quantity of electrons, injected into the insulating film under actual operating conditions of the device, to reach the critical injected electron quantity is estimated as the expected lifetime of the insulating film.

Thus, compared to the known method (e.g., the "1/E" or "E" model) for predicting the lifetime from the critical injected hole quantity or stress electric field, the lifetime of an insulating film under actual operating conditions of a semiconductor device can be predicted more accurately. That is to say, the lifetime of an insulating film, in which a weak electric field has been formed, can be predicted accurately enough.

Also, according to the second lifetime prediction method, the lifetime of the insulating film, predicted under the actual operating conditions of the device, is longer than the lifetime predicted by the known "E" model method. Thus, an increased margin is available for the thickness of the insulating film or fabrication process conditions, for example. That is to say, the thickness of the insulating film or the fabrication process conditions, which have been non-applicable to the fabrication of semiconductor devices, are now applicable in the present invention. As a result, the performance of semiconductor devices, like the operating speeds thereof, can be improved.

In the second lifetime prediction method, the first step preferably includes the steps of actually measuring a dielectric breakdown time it takes for an insulating film under test, having the same specification as the insulating film, to cause the dielectric breakdown by applying a stress voltage to the insulating film under test; and then obtaining the total injected electron quantity using the dielectric breakdown time actually measured and an electron current flowing through the insulating film under test when the stress voltage is applied thereto.

In this manner, the total injected electron quantity can be estimated accurately.

In the second lifetime prediction method, the second step preferably includes the step of deriving the expected lifetime of the insulating film by $$T_{BD}=Q_{BDcrit}/I_G$$

where $T_{BD}$ is the lifetime of the insulating film, $Q_{BDcrit}$ is the critical injected electron quantity and $I_G$ is the amount of the electron current flowing through the insulating film under the actual operating conditions of the device.

In this manner, the lifetime of the insulating film can be predicted easily.

In the second lifetime prediction method, the first step preferably includes the step of obtaining, as a critical injected hole quantity, a total injected hole quantity that has reached a constant value against the variation in stress voltage applied to the insulating film. The total injected hole quantity is a total quantity of holes injected into the insulating film before the film causes the breakdown. And the first step preferably further includes the step of deriving the critical injected electron quantity from the critical injected hole quantity after that.

In such an embodiment, the critical injected electron quantity can be obtained without calculating the total injected electron quantity. Thus, the lifetime of an insulating film can be predicted easily.

In this particular embodiment, the step of obtaining the critical injected hole quantity in the first step preferably includes the steps of: actually measuring a dielectric breakdown time it takes for an insulating film under test, having the same specification as the insulating film, to cause the dielectric breakdown by applying a stress voltage to the insulating film under test; and then deriving the total injected hole quantity from the dielectric breakdown time actually measured and a hole current flowing through the insulating film under test when the stress voltage is applied thereto.

In this manner, the total injected hole quantity can be estimated accurately.

Alternatively, the step of obtaining the critical injected hole quantity in the first step may include the step of finding a correlation between a stress voltage applied to an insulating film under test and a time it takes for the slope of a time dependent variation of an A-mode stress induced leakage current to start to decline in a double logarithmic plot. The insulating film under test has the same specification as the insulating film. The A-mode stress induced leakage current flows through the insulating film under test. The step may further include the step of actually measuring a first dielectric breakdown time it takes for the insulating film under test to cause the dielectric breakdown with a first stress voltage applied to the insulating film under test. The step may further include the step of estimating, from the correlation and the first dielectric breakdown time, a second dielectric breakdown time it takes for the insulating film, to which a second stress voltage is applied, to cause the dielectric breakdown.

And the step may further include the step of deriving the total injected hole quantity from the second dielectric breakdown time and a hole current flowing through the insulating film under test when the second stress voltage is applied thereto.

In this manner, the total injected hole quantity can be obtained in a short time.

In the second lifetime prediction method, the lifetime of the insulating film, which is estimated in the second step, is preferably regarded as a first provisional lifetime. And the method preferably further includes a third step of obtaining, as a critical injected hole quantity, a total injected hole quantity that has reached a constant value against the variation in stress voltage applied to the insulating film. The total injected hole quantity is a total quantity of holes injected into the insulating film before the film causes the breakdown. The method preferably further includes a fourth step of estimating, as a second provisional lifetime of the insulating film, a time it takes for a total quantity of holes, injected into the insulating film under the actual operating conditions of the device, to reach the critical injected hole quantity. And the method preferably further includes a fifth step of predicting the lifetime of the insulating film from the first and second provisional lifetimes.

In this manner, the lifetime of the insulating film can be predicted exactly.

In this particular embodiment, the third step preferably includes the step of actually measuring a dielectric breakdown time it takes for an insulating film under test, having the same specification as the insulating film, to cause the dielectric breakdown by applying a stress voltage to the insulating film under test. And the third step preferably further includes the step of deriving the total injected hole quantity from the dielectric breakdown time actually measured and a hole current flowing through the insulating film under test when the stress voltage is applied thereto.

In this manner, the total injected hole quantity can be estimated accurately.

Alternatively, the third step may include the step of finding a correlation between a stress voltage applied to an insulating film under test and a time it takes for the slope of a time dependent variation of an A-mode stress induced leakage current to start to decline in a double logarithmic plot. The insulating film under test has the same specification as the insulating film. The A-mode stress induced leakage current flows through the insulating film under test. The third step may further include the step of actually measuring a first dielectric breakdown time it takes for the insulating film under test to cause the dielectric breakdown with a first stress voltage applied to the insulating film under test. The third step may further include the step of estimating, from the correlation and the first dielectric breakdown time, a second dielectric breakdown time it takes for the insulating film, to which a second stress voltage is applied, to cause the dielectric breakdown. And the third step may further include the step of deriving the total injected hole quantity from the second-dielectric breakdown time and a hole current flowing through the insulating film under test when the second stress voltage is applied thereto.

In this manner, the total injected hole quantity can be obtained in a short time.

As another alternative, the fourth step may include the step of obtaining the second provisional lifetime by $$T_{BDh}=Q_{Pcrit}/I_{sub}$$

where $T_{BDh}$ is the second provisional lifetime, $Q_{Pcrit}$ is the critical injected hole quantity and $I_{sub}$ is the amount of the hole current flowing through the insulating film under the actual operating conditions of the device.

In such an embodiment, the second provisional lifetime can be obtained easily.

As yet another alternative, the fifth step may include the step of predicting the lifetime of the insulating film by $$1/T_{BD} = 1/T_{BDe} + 1/T_{BDh}$$

where $T_{BD}$ is the lifetime of the insulating film, $T_{BDe}$ is the first provisional lifetime and $T_{BDh}$ is the second provisional lifetime.

In this manner, the lifetime of the insulating film can be predicted easily.

An inventive method for reliability testing of a semiconductor device is adapted to test the reliability of a semiconductor device by estimating a time it takes for an insulating film for use in the device to cause a dielectric breakdown. The method includes a first step of obtaining, as a critical injected electron quantity, a total injected electron quantity that has reached a constant value against a variation in stress voltage applied to the insulating film. The total injected electron quantity is a total quantity of electrons injected into the insulating film before the film causes the breakdown. The method further includes a second step of estimating a first time it takes for a total quantity of electrons, injected into the insulating film under actual operating conditions of the device, to reach the critical injected electron quantity. If the first time is equal to or greater than a predetermined value, the method further includes third and fourth steps. The third step includes estimating a second time it takes for a first insulating film under test to cause a dielectric breakdown by applying a test voltage, higher than a voltage applied to the insulating film under the actual operating conditions of the device, to the first insulating film under test. The first insulating film under test has the same specification as the insulating film. The third step further includes determining, by the second time, a reference control level for a preselected control point of the insulating film after that. The fourth step includes applying the test voltage to a second insulating film under test, which also has the same specification as the insulating film, to measure the control point of the second insulating film under test. The fourth step further includes determining whether or not a result of the measurement meets the reference control level after that.

In the inventive reliability testing method, the reliability of a semiconductor device can be tested using the first time, i.e., the lifetime of the insulating film at an actual operating voltage as predicted by the second lifetime prediction method of the present invention. Thus, compared to the known method (e.g., the "1/E" or "E" model), by which the lifetime is predicted from the critical injected hole quantity or stress electric field, the lifetime of the insulating film can be predicted more accurately. As a result, the reliability of the semiconductor device can be tested more appropriately.

BEST MODE FOR CARRYING OUT THE INVENTION

Embodiment 1

Hereinafter, a lifetime prediction method for an insulating film according to a first embodiment of the present invention will be described with reference to the accompanying drawings as being applied to predicting the lifetime of a gate insulating film for a MOSFET. It should be noted that the lifetime prediction method of the first embodiment utilizes the "nondestructive lifetime prediction method" described above.

Figure 1:
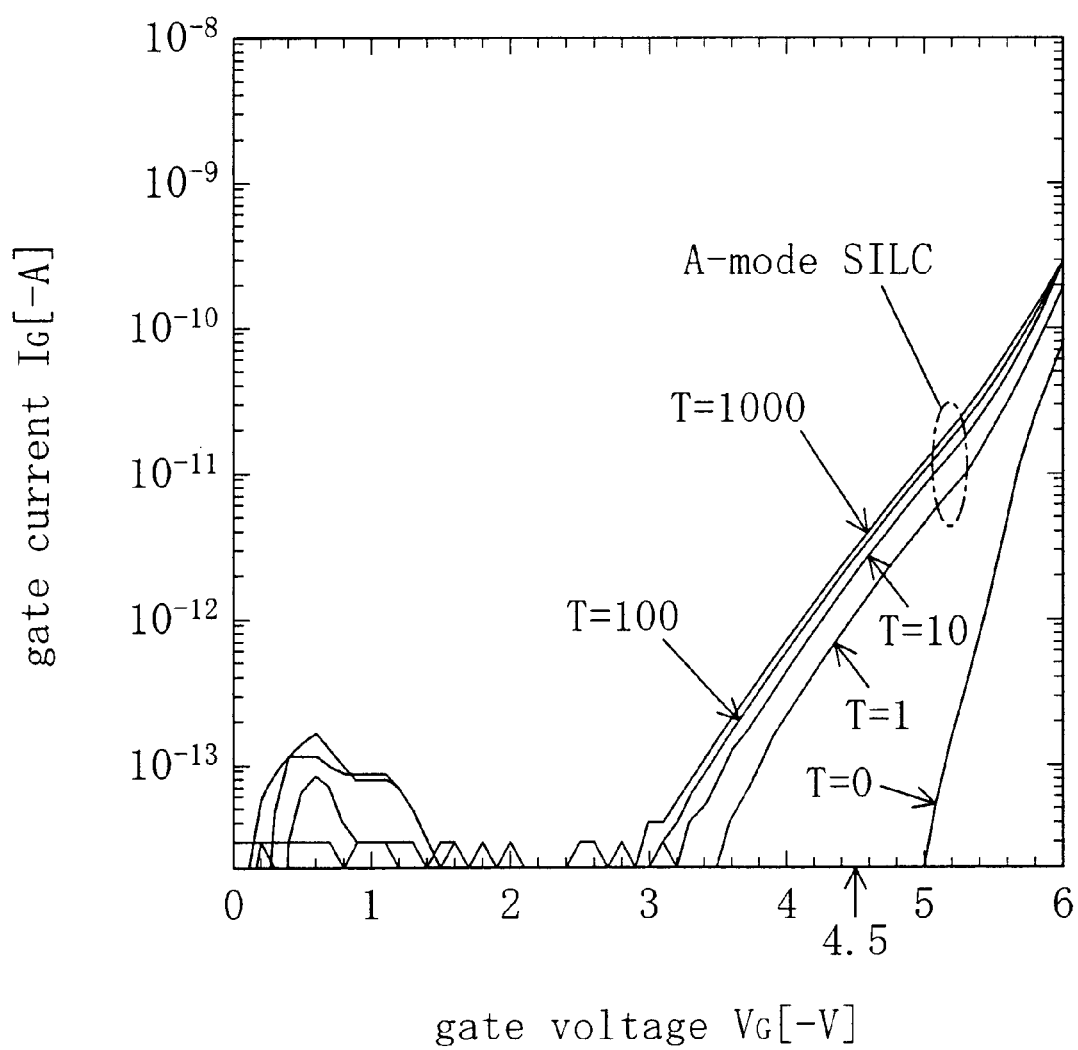
FIG. 1 is a graph illustrating I–V characteristics where a stress voltage of –6.0 V is applied to the gate electrode of a MOSFET for a predetermined period of time.
Figure 2:
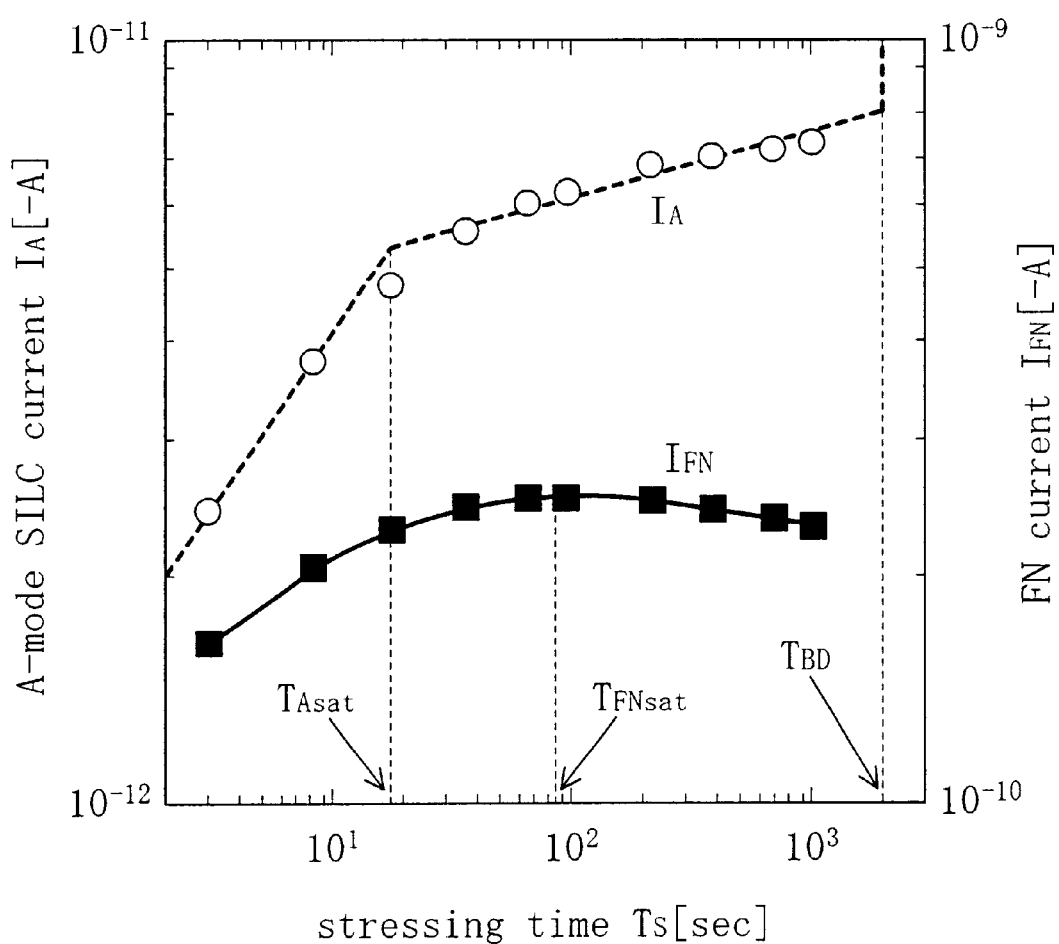
FIG. 2 is a graph illustrating relationships between the A-mode stress induced leakage current or FN current and the stressing time where a stress voltage of –6.0 V is applied to the gate electrode of a MOSFET.
Figure 3:
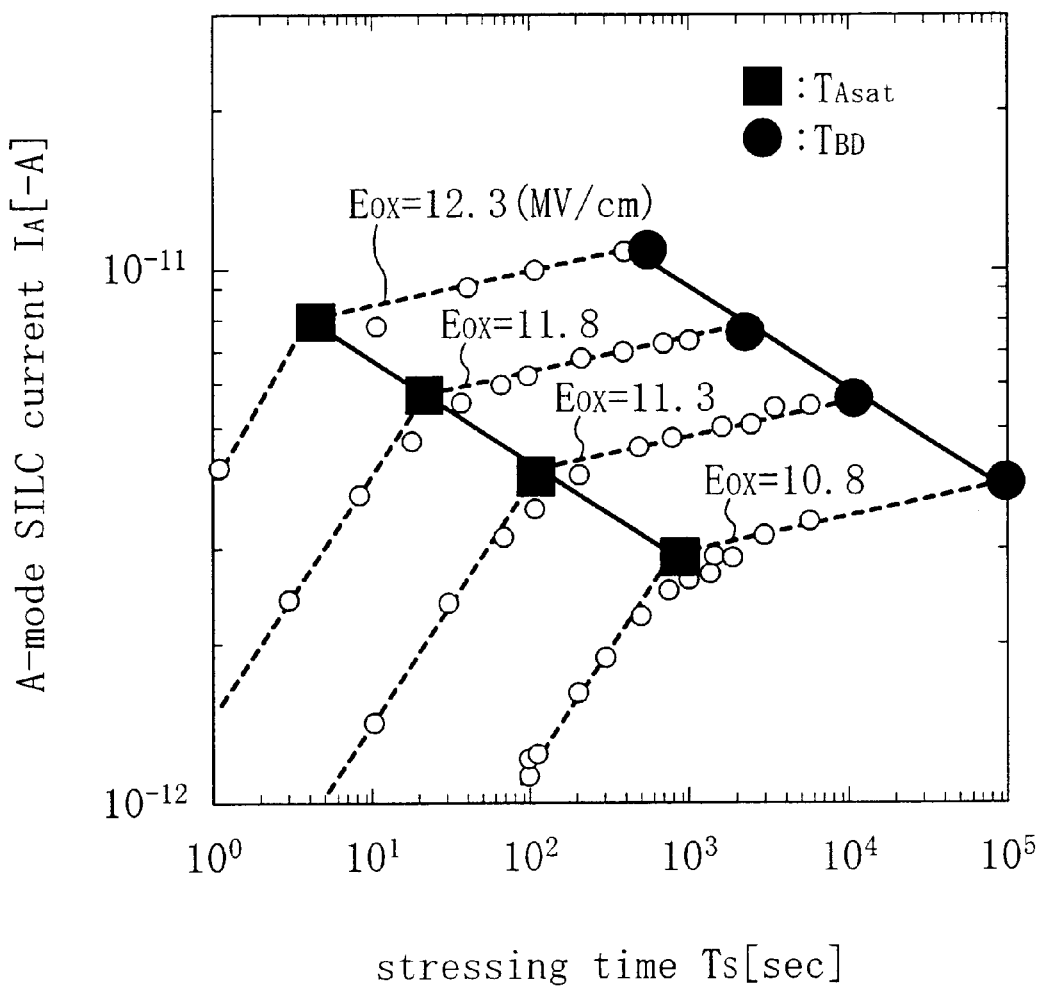
FIG. 3 is a graph illustrating relationships between the A-mode stress induced leakage current and the stressing time where various stress voltages are applied to the gate electrode of a MOSFET.
Figure 4:
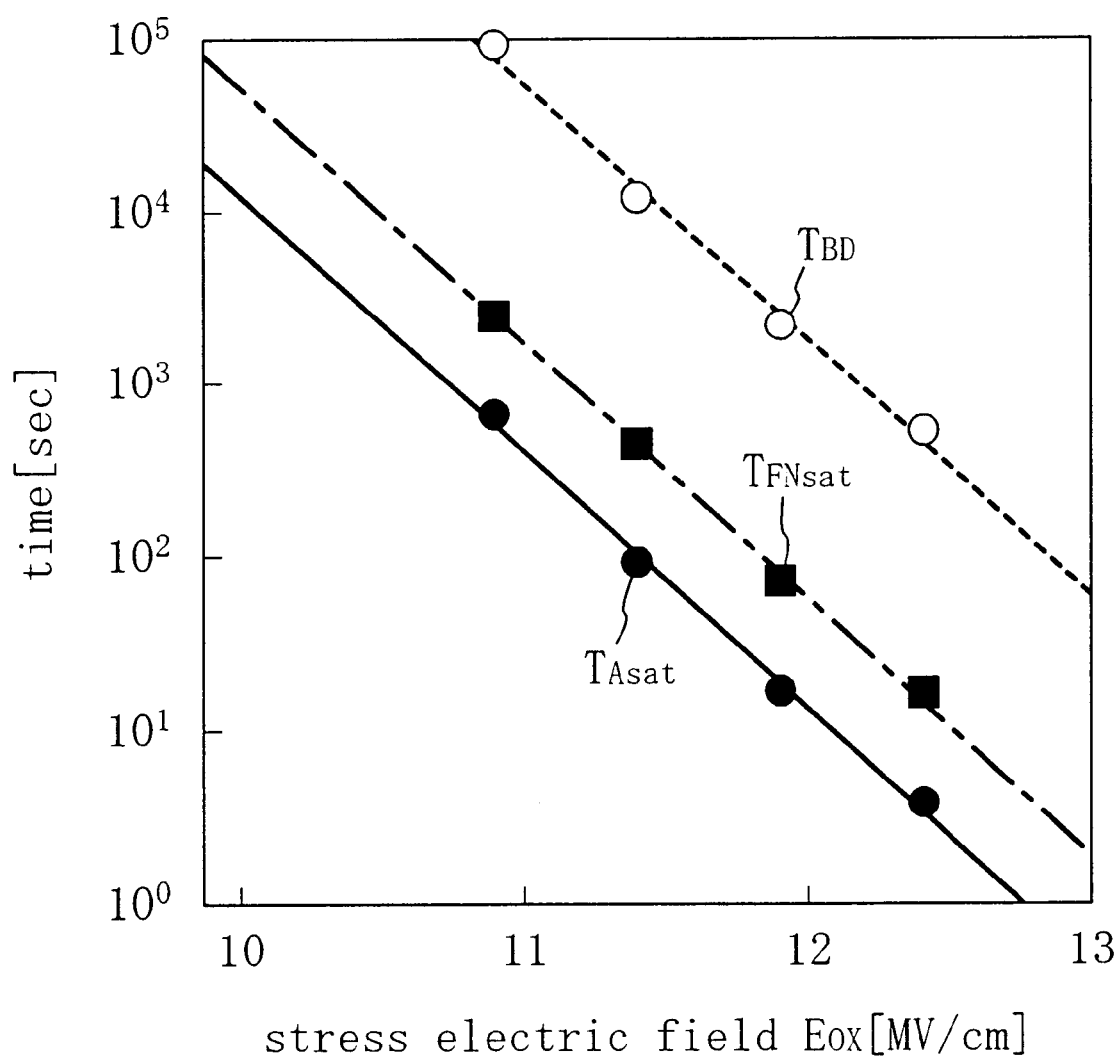
FIG. 4 is a graph illustrating relationships between the polarity change time $T_{Asat}$, saturation time $T_{FNsat}$ or dielectric breakdown time $T_{BD}$ and the stress electric field $E_{OX}$ for use in a first inventive lifetime prediction method for an insulating film.
Figure 5:
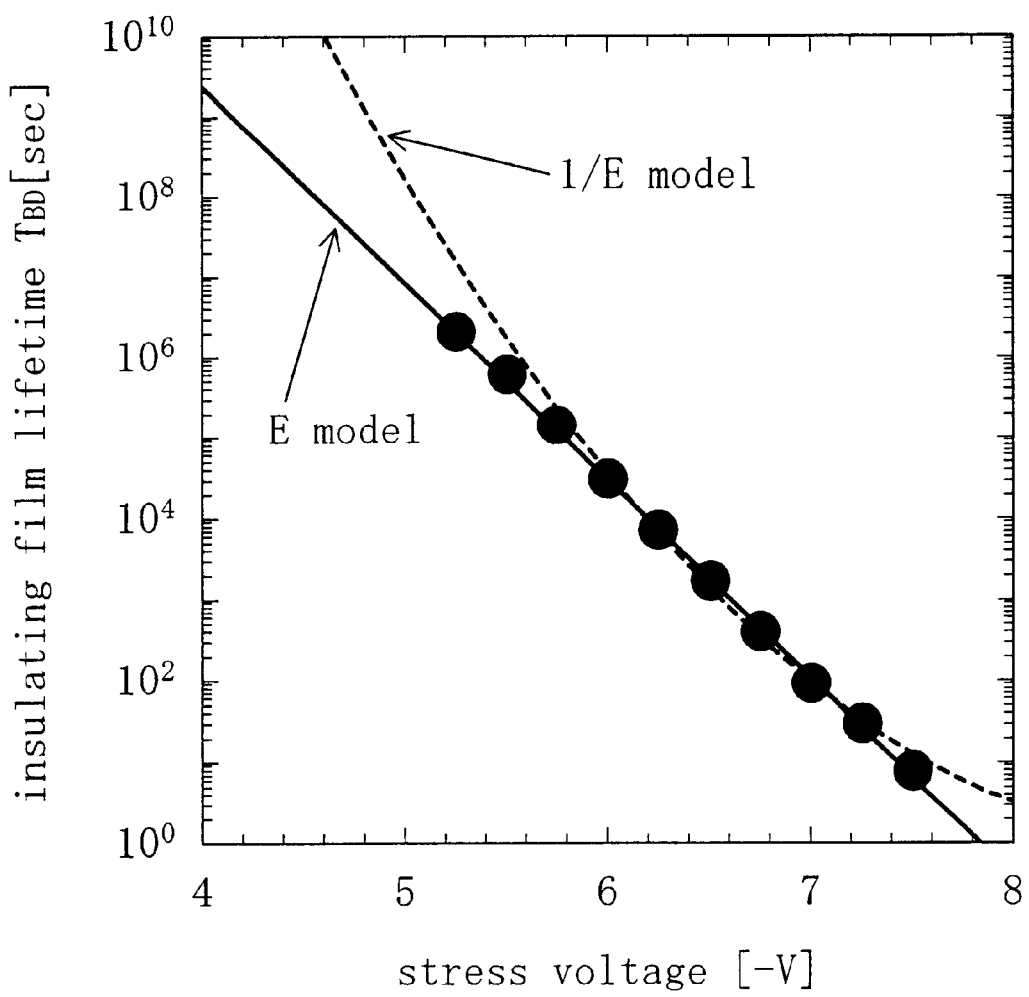
FIG. 5 is a graph illustrating a relationship between the insulating film lifetime actually measured and the stress voltage.

First, a correlation between a stress condition imposed on an insulating film to be tested, having the same specification as a gate insulating film that should have its lifetime predicted, and a polarity change time $T_{Asat}$ is found. The insulating film to be tested and the gate insulating film, of which the lifetime should be predicted, will be herein simply called an "insulating film under test" and a "gate insulating film", respectively. The polarity change time $T_{Asat}$ is a time it takes for the slope of a time dependent variation of an A-mode stress induced leakage current, flowing through the insulating film under test, to start to decline in a double logarithmic plot. In the double logarithmic plot, the coordinate thereof should represent the A-mode stress induced leakage current, while the abscissa thereof a stressing time (see FIG. 2). For example, a correlation between a stress electric field $E_{OX}$ and the polarity change time $T_{Asat}$ may be found. The stress electric field $E_{OX}$ is an electric field actually formed in the gate insulating film upon the application of a stress voltage thereto. Specifically, the time dependent variations of the A-mode stress induced leakage current are measured for at least two stress electric fields $E_{OX}$ to obtain the polarity change times $T_{Asat}$. In this manner, the correlation between the stress electric field $E_{OX}$ and the polarity change time $T_{Asat}$ can be found.

Figure 9:
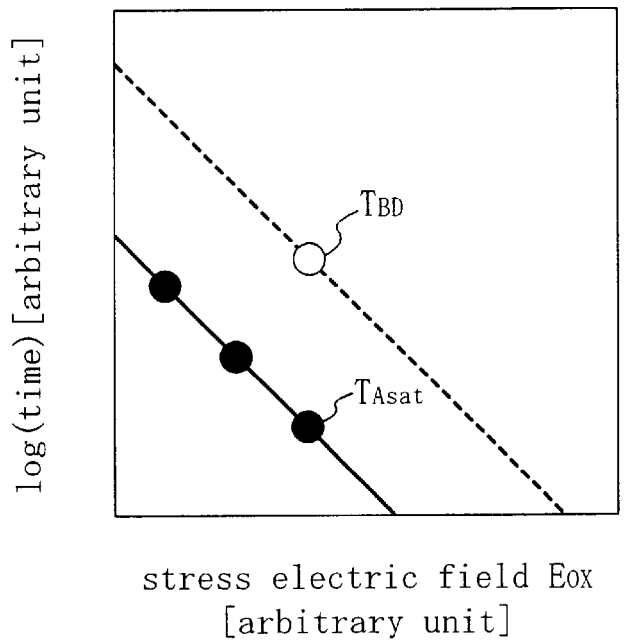
FIG. 9 is a graph illustrating relationships between the polarity change time $T_{Asat}$ or dielectric breakdown time $T_{BD}$ and the stress electric field $E_{OX}$ for use in a lifetime prediction method for an insulating film according to a first embodiment of the present invention.

FIG. 9 is a graph representing a correlation between the stress electric field $E_{OX}$ and the polarity change time $T_{Asat}$ as a semilogarithmic plot (the ordinates of which (i.e., the times) are represented on logarithmic scales). The correlation illustrated in FIG. 9 was found by estimating the polarity change times $T_{Asat}$ for three stress electric fields $E_{OX}$.

As shown in FIG. 9, there is a correlation (i.e., a negative proportionality in the example shown in FIG. 9 using the semilogarithmic plot) between the stress electric field $E_{OX}$ and the polarity change time $T_{Asat}$ represented on logarithmic scales.

Next, a first stress electric field $E_{OX}$ is applied to the insulating film under test, thereby actually measuring a first dielectric breakdown time $T_{BD}$ it takes for the insulating film under test to cause a dielectric breakdown. In this case, the intenser the first stress electric field $E_{OX}$, the shorter the time taken to actually measure the first dielectric breakdown time $T_{BD}$ can be.

Subsequently, with reference to FIG. 9, for example, a line (see the dashed line), which passes the first dielectric breakdown time $T_{BD}$ and is parallel to the line representing the correlation between the stress electric field $E_{OX}$ and the polarity change time $T_{Asat}$ (see the solid line), is drawn. In this manner, the correlation between the stress electric field $E_{OX}$ and the dielectric breakdown time $T_{BD}$ can be found. Suppose the correlation between the stress electric field $E_{OX}$ and the polarity change time $T_{Asat}$ should be represented without using FIG. 9, i.e., the semilogarithmic plot. In that case, a graph, which passes the first dielectric breakdown time $T_{BD}$ and is always equally spaced from a graph (curve) representing the correlation between the stress electric field $E_{OX}$ and the polarity change time $T_{Asat}$, should be drawn. Then, the correlation between the stress electric field $E_{OX}$ and the dielectric breakdown time $T_{BD}$ can also be found.

Subsequently, by reference to the correlation between the stress electric field $E_{OX}$ and the dielectric breakdown time $T_{BD}$ as represented by the dashed line in FIG. 9, a second dielectric breakdown time $T_{BD}$ is estimated. The second dielectric breakdown time $T_{BD}$ is a time it takes for the gate insulating film to cause a dielectric breakdown when a second stress electric field $E_{OX}$ is applied thereto.

As described above, according to the first embodiment, the correlation between the stress electric field $E_{OX}$ and the polarity change time $T_{Asat}$ is found, and the first dielectric breakdown time $T_{BD}$ of the insulating film under test, to which the first stress electric field $E_{OX}$ is applied, is actually measured. Then, using the correlation between the stress electric field $E_{OX}$ and the polarity change time $T_{Asat}$ and the first dielectric breakdown time $T_{BD}$, the second dielectric breakdown time $T_{BD}$ of the gate insulating film, to which the second stress electric field $E_{OX}$ is applied, is estimated. Thus, the dielectric breakdown time of the insulating film under test does not have to be actually measured in an accelerated test. As a result, the lifetime of the gate insulating film can be predicted in a short time.

Also, according to the first embodiment, the lifetime of the gate insulating film is predicted by using the polarity change time $T_{Asat}$ and dielectric breakdown time $T_{BD}$ that are obtained by an accelerated test. Thus, compared to the known method using only the dielectric breakdown time $T_{BD}$ obtained by an accelerated test, the lifetime of the gate insulating film can be predicted more reliably.

In the first embodiment, the lifetime of a gate insulating film for a MOSFET is predicted. However, the insulating film that should have its lifetime predicted is not limited to any particular type.

Also, in the first embodiment, the stress electric field $E_{OX}$ is used as an exemplary stress condition. Alternatively, a stress voltage itself may be used instead.

Furthermore, in the first embodiment, the thickness of the gate insulating film is preferably 10 nm or less. Then, the A-mode stress induced leakage current can be measured accurately enough.

Embodiment 2

Hereinafter, a lifetime prediction method for an insulating film according to a second embodiment of the present invention will be described with reference to the accompanying drawings as being applied to predicting the lifetime of a gate insulating film for a MOSFET. It should be noted that the lifetime prediction method of the second embodiment utilizes the "nondestructive lifetime prediction method" described above.

First, a correlation between a stress condition (e.g., a stress electric field $E_{OX}$) imposed on an insulating film under test, having the same specification as the gate insulating film, and a saturation time $T_{FNsat}$ is found. The saturation time $T_{FNsat}$ is a time it takes for an FN current, flowing through the insulating film under test, to start to decrease. Specifically, the time dependent variations of the FN current are measured for at least two stress electric fields $E_{OX}$ to obtain the saturation times $T_{FNsat}$. In this manner, the correlation between the stress electric field $E_{OX}$ and the saturation time $T_{FNsat}$ can be found. In this case, the stress voltage applied to the insulating film under test and the gate voltage may be set equal to each other (e.g., to a voltage with an absolute value of about 6 V). Then, the time dependent variation of the FN current can be measured without suspending the stressing. It should be noted, however, that the magnitude of the gate voltage applied to the insulating film under test to measure the FN current is not limited to any particular value so long as the voltage is equal to or greater than a predetermined value.

Figure 10:
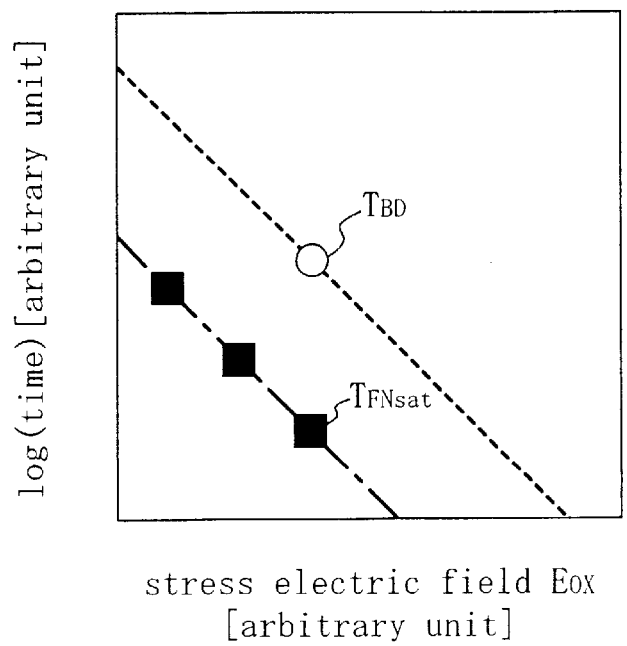
FIG. 10 is a graph illustrating relationships between the saturation time $T_{FNsat}$ or dielectric breakdown time $T_{BD}$ and the stress electric field $E_{OX}$ for use in a lifetime prediction method for an insulating film according to a second embodiment of the present invention.

FIG. 10 is a graph representing a correlation between the stress electric field $E_{OX}$ and the saturation time $T_{FNsat}$ as a semilogarithmic plot (the ordinates of which (i.e., the times) are represented on logarithmic scales). The correlation illustrated in FIG. 10 was found by estimating the saturation times $T_{FNsat}$ for three stress electric fields $E_{OX}$.

As shown in FIG. 10, there is a correlation (i.e., a negative proportionality in the example shown in FIG. 10 using the semilogarithmic plot) between the stress electric field $E_{OX}$ and the saturation time $T_{FNsat}$ represented on logarithmic scales.

Next, a first stress electric field $E_{OX}$ is applied to the insulating film under test, thereby actually measuring a first dielectric breakdown time $T_{BD}$ it takes for the insulating film under test to cause a dielectric breakdown. In this case, the intenser the first stress electric field $E_{OX}$, the shorter the time taken to actually measure the first dielectric breakdown time $T_{BD}$ can be.

Subsequently, with reference to FIG. 10, for example, a line (see the dashed line), which passes the first dielectric breakdown time $T_{BD}$ and is parallel to the line representing the correlation between the stress electric field $E_{OX}$ and the saturation time $T_{FNsat}$ (see the one-dot chain), is drawn. In this manner, the correlation between the stress electric field $E_{OX}$ and the dielectric breakdown time $T_{BD}$ can be found. Suppose the correlation between the stress electric field $E_{OX}$ and the saturation time $T_{FNsat}$ should be represented without using FIG. 10, i.e., the semilogarithmic plot. In that case, a graph, which passes the first dielectric breakdown time $T_{BD}$ and is always equally spaced from a graph (curve) representing the correlation between the stress electric field $E_{OX}$ and the saturation time $T_{FNsat}$, should be drawn. Then, the correlation between the stress electric field $E_{OX}$ and the dielectric breakdown time $T_{BD}$ can be found.

Subsequently, by reference to the correlation between the stress electric field $E_{OX}$ and the dielectric breakdown time $T_{BD}$ as represented by the dashed line in FIG. 10, a second dielectric breakdown time $T_{BD}$ is estimated. The second dielectric breakdown time $T_{BD}$ is a time it takes for the gate insulating film to cause a dielectric breakdown when a second stress electric field $E_{OX}$ is applied thereto.

As described above, according to the second embodiment, the correlation between the stress electric field $E_{OX}$ and the saturation time $T_{FNsat}$ is found, and the first dielectric breakdown time $T_{BD}$ of the insulating film under test, to which the first stress electric field $E_{OX}$ is applied, is actually measured. Then, using the correlation between the stress electric field $E_{OX}$ and the saturation time $T_{FNsat}$ and the first dielectric breakdown time $T_{BD}$, the second dielectric breakdown time $T_{BD}$ of the gate insulating film, to which the second stress electric field $E_{OX}$ is applied, is estimated. Thus, the dielectric breakdown time of the insulating film under test does not have to be actually measured in an accelerated test. As a result, the lifetime of the gate insulating film can be predicted in a short time.

Also, according to the second embodiment, the lifetime of the gate insulating film is predicted by using the saturation time $T_{FNsat}$ and dielectric breakdown time $T_{BD}$ that are obtained by an accelerated test. Thus, compared to the known method using only the dielectric breakdown time $T_{BD}$ obtained by an accelerated test, the lifetime of the gate insulating film can be predicted more reliably.

In the second embodiment, the lifetime of a gate insulating film for a MOSFET is predicted. However, the insulating film that should have its lifetime predicted is not limited to any particular type.

Also, in the second embodiment, the stress electric field $E_{OX}$ is used as an exemplary stress condition. Alternatively, a stress voltage itself may be used instead.

Furthermore, in the second embodiment, the thickness of the gate insulating film is preferably 10 nm or less. Then, the FN current can be measured accurately enough.

Embodiment 3

Hereinafter, a lifetime prediction method for an insulating film according to a third embodiment of the present invention will be described with reference to the accompanying drawings as being applied to predicting the lifetime of a gate insulating film for a MOSFET. It should be noted that the lifetime prediction method of the third embodiment utilizes the "nondestructive lifetime prediction method" described above.

First, as in the first embodiment, the polarity change times $T_{Asat}$ of the A-mode stress induced leakage currents, flowing through an insulating film under test having the same specification as the gate insulating film, are obtained for three stress conditions, e.g., three stress electric fields $E_{OX}$.

Next, as in the second embodiment, the saturation times $T_{FNsat}$ of the FN currents, flowing through the insulating film under test, are obtained for three stress conditions, e.g., three stress electric fields $E_{OX}$. In this case, the stress voltage applied to the insulating film under test and the gate voltage may be set equal to each other (e.g., to a voltage with an absolute value of about 6 V). Then, the time dependent variations of the FN currents can be measured without suspending the stressing. It should be noted, however, that the magnitude of the gate voltage applied to the insulating film under test to measure the FN current is not limited to any particular value so long as the voltage is equal to or greater than a predetermined value.

Subsequently, the dielectric breakdown times $T_{BD}$ (first dielectric breakdown times $T_{BD}$), i.e., times it takes for the insulating film under test to cause a dielectric breakdown, are actually measured for three stress conditions, e.g., three stress electric fields $E_{OX}$ (i.e., first stress electric fields $E_{OX}$).

Thereafter, by a least-squares method, for example, functions, approximating the correlations between the stress electric field $E_{OX}$ and the polarity change time $T_{Asat}$, saturation time $T_{FNsat}$ or dielectric breakdown time $T_{BD}$, are defined so that the graphs plotting these functions are equally spaced from each other.

Figure 11:
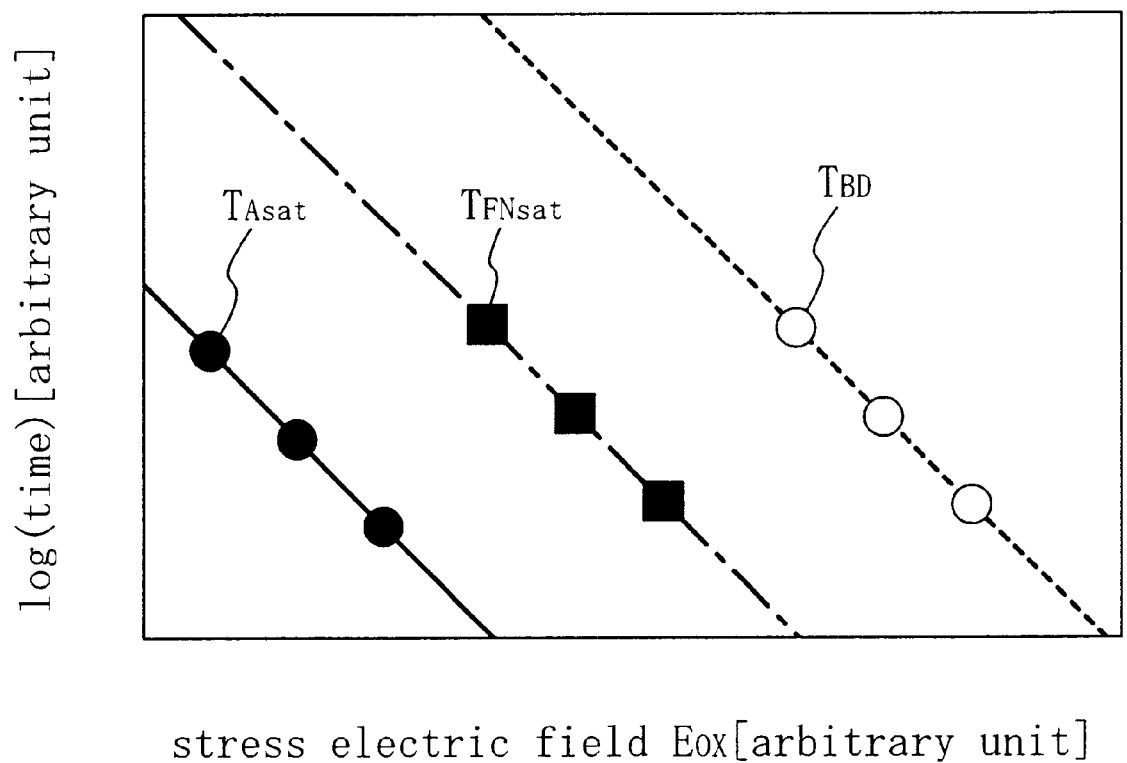
FIG. 11 is a graph illustrating relationships between the polarity change time $T_{Asat}$, saturation time $T_{FNsat}$ or dielectric breakdown time $T_{BD}$ and the stress electric field $E_{OX}$ for use in a lifetime prediction method for an insulating film according to a third embodiment of the present invention.
Figure 12:
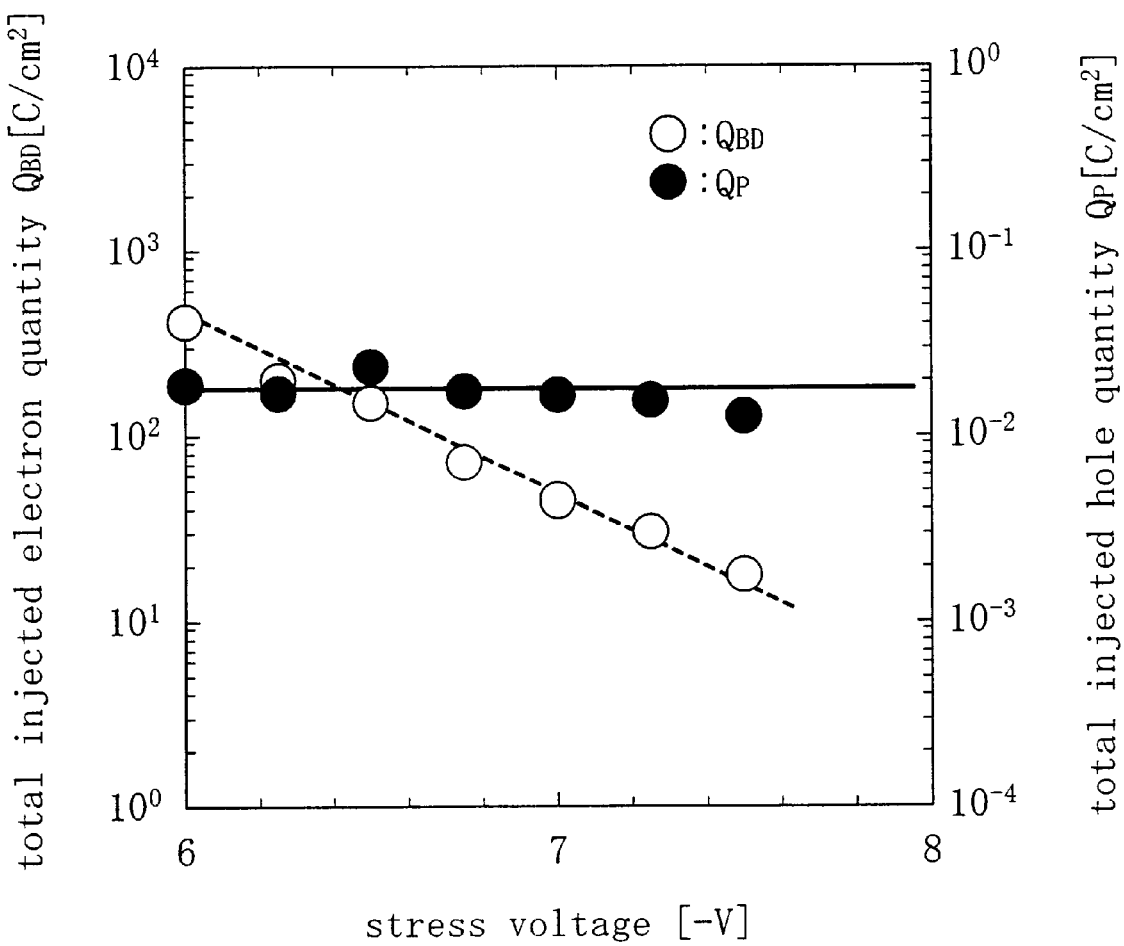
FIG. 12 is a graph illustrating relationships between the total injected hole or electron quantity and the stress voltage for use in a known lifetime prediction method for an insulating film.
Figure 13:
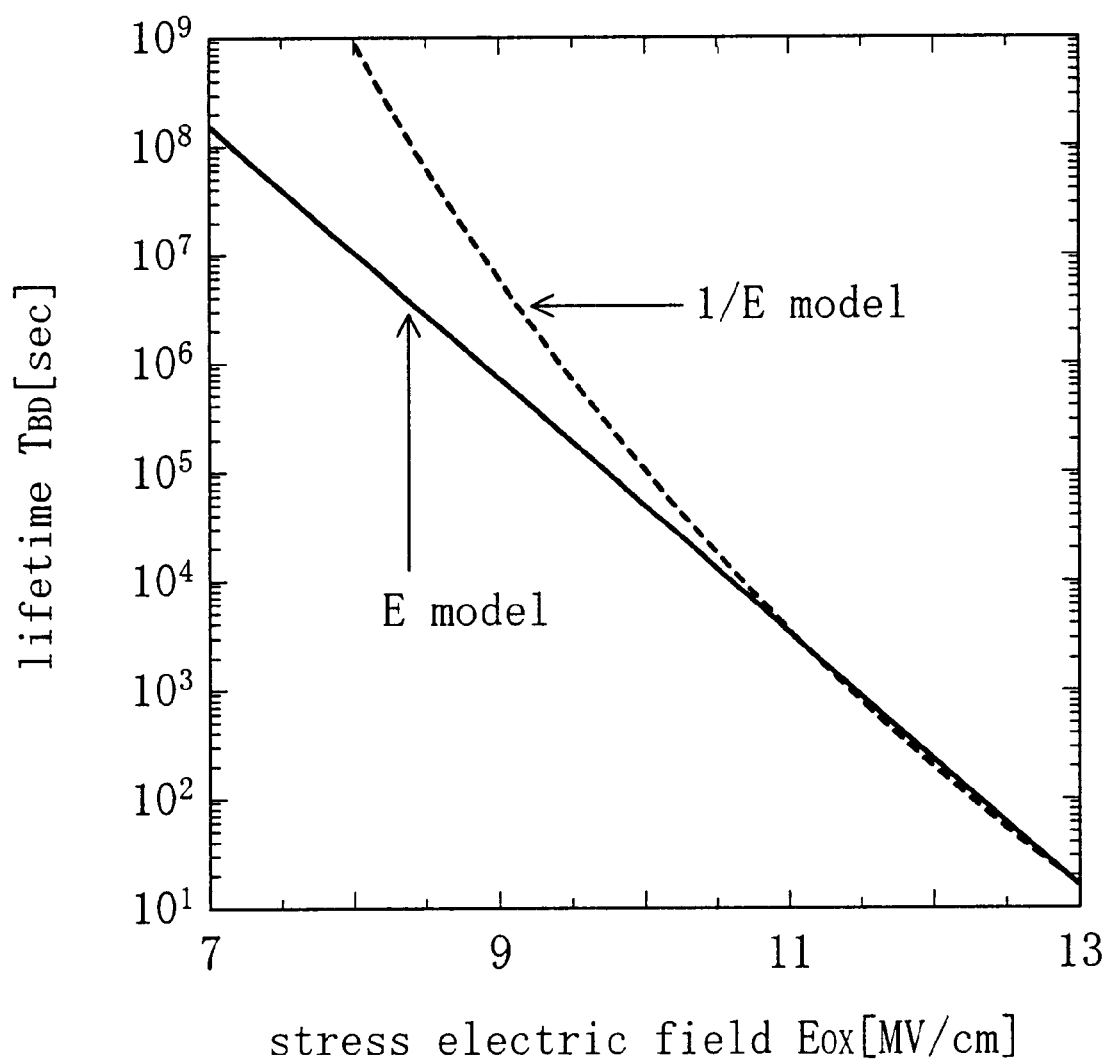
FIG. 13 is a graph illustrating relationships between the insulating film lifetime, predicted after the "1/E" or "E" model, and the stress electric field for use in the known lifetime prediction method.

FIG. 11 is a graph illustrating correlations between the stress electric field $E_{OX}$ and the polarity change time $T_{Asat}$, saturation time $T_{FNsat}$ or dielectric breakdown time $T_{BD}$ by semilogarithmic plots. The ordinates of these plots (i.e., the times) are represented on logarithmic scales.

As shown in FIG. 11, the lines, representing the correlations between the stress electric field $E_{OX}$ and the polarity change time $T_{Asat}$, saturation time $T_{FNsat}$ or dielectric breakdown time $T_{BD}$ (see the solid, one-dot-chain and dashed lines, respectively), are parallel to each other.

Subsequently, by reference to the correlation between the stress electric field $E_{OX}$ and the dielectric breakdown time $T_{BD}$ as represented by the dashed line in FIG. 11, a second dielectric breakdown time $T_{BD}$ is estimated. The second dielectric breakdown time $T_{BD}$ is a time it takes for the gate insulating film to cause a dielectric breakdown when an arbitrary stress electric field $E_{OX}$ (i.e., a second stress electric field $E_{OX}$) is applied thereto.

As described above, according to the third embodiment, the correlations between the stress electric field $E_{OX}$ and the polarity change time $T_{Asat}$ or saturation time $T_{FNsat}$ are found. Next, the first dielectric breakdown time $T_{BD}$ of the insulating film under test, to which the first stress electric field $E_{OX}$ is applied, is actually measured. Then, using the correlations between the stress electric field $E_{OX}$ and the polarity change time $T_{Asat}$ or saturation time $T_{FNsat}$ and the first dielectric breakdown time $T_{BD}$, the second dielectric breakdown time $T_{BD}$ of the gate insulating film, to which the second stress electric field $E_{OX}$ is applied, is estimated. Thus, the dielectric breakdown time of the insulating film under test does not have to be actually measured in an accelerated test. As a result, the lifetime of the gate insulating film can be predicted in a short time.

Also, according to the third embodiment, the lifetime of the gate insulating film is predicted by using the polarity change time $T_{Asat}$, saturation time $T_{FNsat}$ and dielectric breakdown time $T_{BD}$ that are all obtained by an accelerated test. Thus, compared to the known method using only the dielectric breakdown time $T_{BD}$ obtained by an accelerated test, the lifetime of the gate insulating film can be predicted more reliably.

In the third embodiment, the lifetime of a gate insulating film for a MOSFET is predicted. However, the insulating film that should have its lifetime predicted is not limited to any particular type.

Also, in the third embodiment, the stress electric field $E_{OX}$ is used as an exemplary stress condition. Alternatively, a stress voltage itself may be used instead.

Furthermore, in the third embodiment, the thickness of the gate insulating film is preferably 10 nm or less. Then, the A-mode stress induced leakage current and FN current can be measured accurately enough.

Moreover, in the third embodiment, the polarity change times $T_{Asat}$ or saturation times $T_{FNsat}$ are obtained for three stress electric fields $E_{OX}$. However, the number of stress electric fields $E_{OX}$ is not limited thereto, but the polarity change times $T_{Asat}$ or saturation times $T_{FNsat}$ may be obtained for at least two stress electric fields $E_{OX}$.

Furthermore, in the third embodiment, the first dielectric breakdown times $T_{BD}$ are actually measured for three first stress electric fields $E_{OX}$. However, the number of first stress electric fields $E_{OX}$ is not limited thereto, but the first dielectric breakdown time $T_{BD}$ may be actually measured for at least one first stress electric field $E_{OX}$.

Embodiment 4

Hereinafter, a lifetime prediction method for an insulating film according to a fourth embodiment of the present invention will be described with reference to the accompanying drawings as being applied to predicting the lifetime of a gate insulating film for a MOSFET. In the lifetime prediction method of the fourth embodiment, the lifetime of an insulating film is predicted after the "DCC" model described above.

Figure 6:
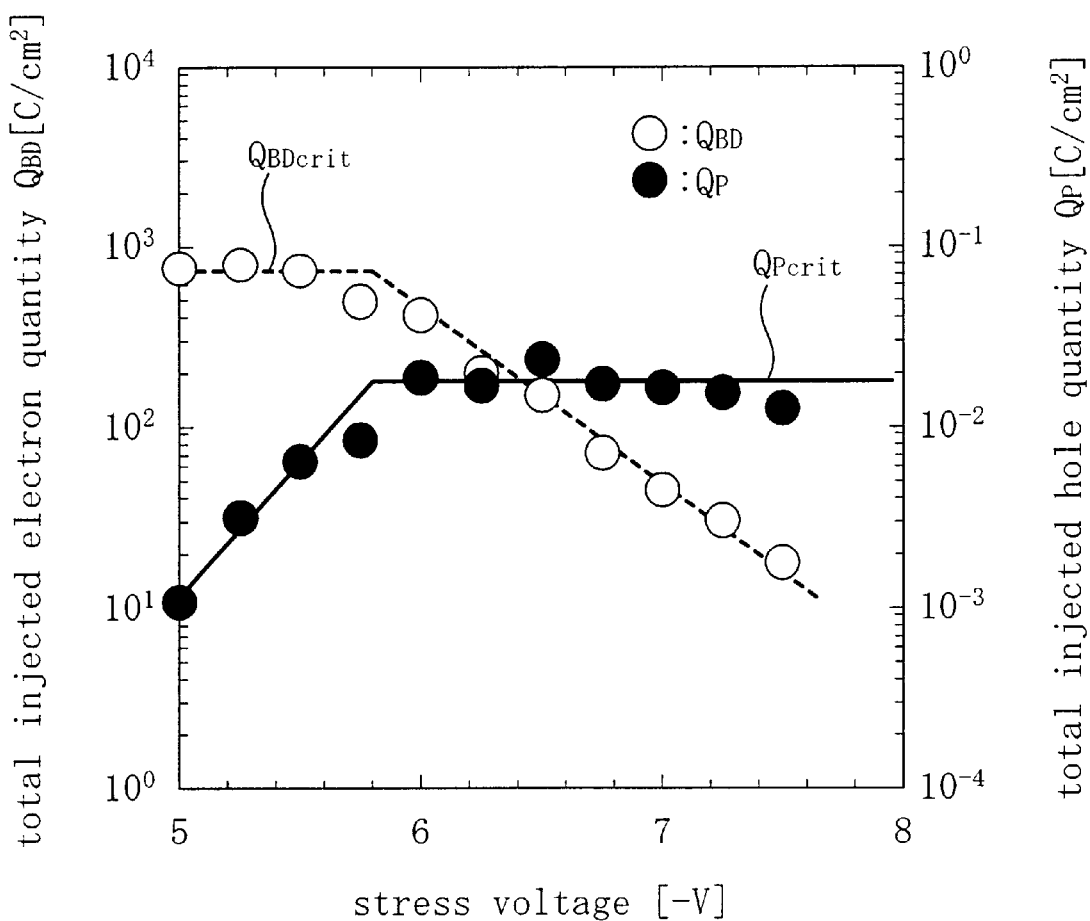
FIG. 6 is a graph illustrating relationships between the total injected hole or electron quantity, calculated from the insulating film lifetime actually measured, and the stress voltage for use in a second inventive lifetime prediction method for an insulating film.
Figure 7:
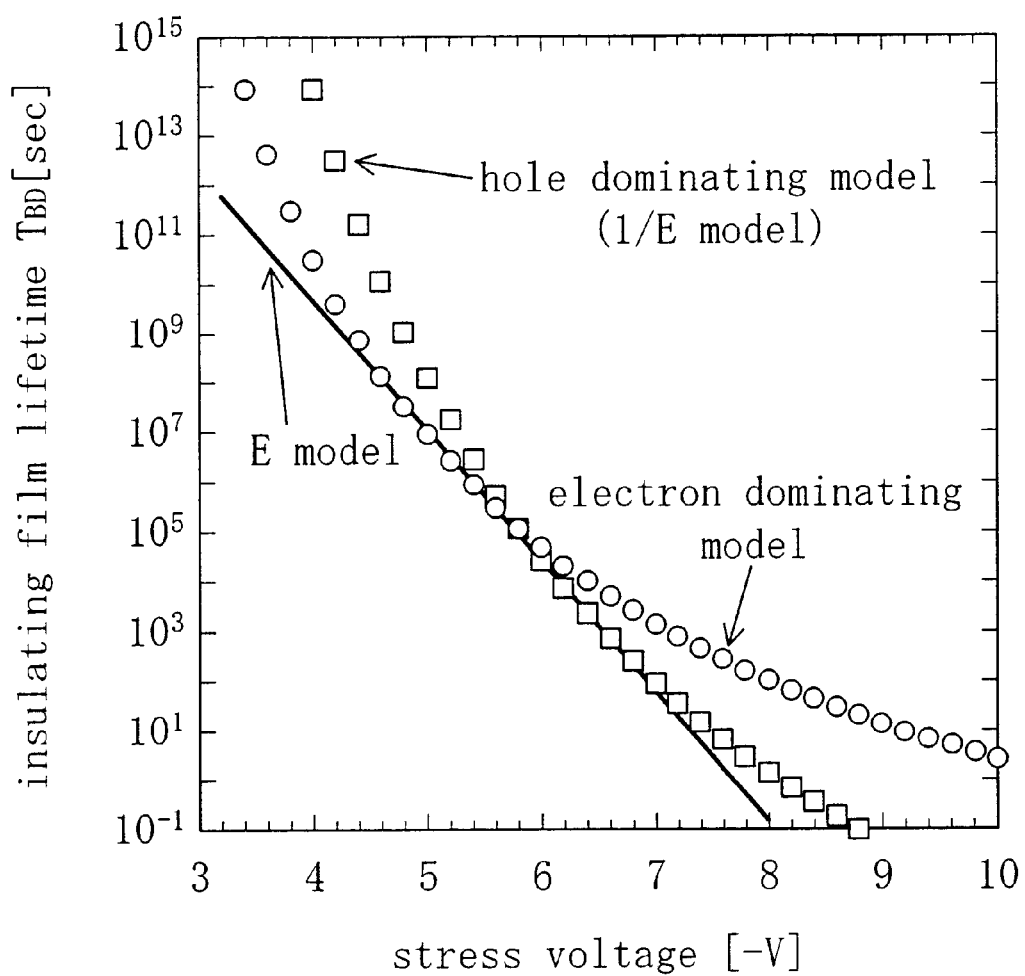
FIG. 7 is a graph illustrating relationships between the insulating film lifetime, predicted after the "electron dominating model" or "hole dominating model", and the stress voltage for use in the second inventive lifetime prediction method.

First, a total injected electron quantity $Q_{BD}$, which has reached a constant value against a variation in stress voltage $V_{stress}$ applied to a gate insulating film that should have its lifetime predicted, is obtained as a critical injected electron quantity $Q_{BDcrit}$. The gate insulating film, of which the lifetime should be predicted, will be herein simply called a "gate insulating film". The total injected electron quantity $Q_{BD}$ is a total quantity of electrons injected into the gate insulating film before the film causes a dielectric breakdown. Specifically, by applying the stress voltage $V_{stress}$ to an insulating film to be tested having the same specification as the gate insulating film, a dielectric breakdown time it takes for the insulating film to be tested to cause a dielectric breakdown is actually measured. The insulating film to be tested will be herein simply called an "insulating film under test". Then, using the dielectric breakdown time actually measured and an electron current flowing through the insulating film under test at the stress voltage $V_{stress}$, the total injected electron quantity $Q_{BD}$ is obtained. Thereafter, by plotting the total injected electron quantities $Q_{BD}$, obtained for various stress voltages $V_{stress}$, as shown in FIG. 6, for example, the critical injected electron quantity $Q_{BDcrit}$ is obtained.

In the same way, a total injected hole quantity $Q_P$, which has reached a constant value against a variation in stress voltage $V_{stress}$ applied to the gate insulating film, is obtained as a critical injected hole quantity $Q_{Pcrit}$. The total injected hole quantity $Q_P$ is a total quantity of holes injected into the gate insulating film before the film causes a dielectric breakdown. Specifically, by applying the stress voltage $V_{stress}$ to the insulating film under test, a dielectric breakdown time it takes for the insulating film under test to cause a dielectric breakdown is actually measured. Then, using the dielectric breakdown time actually measured and a hole current flowing through the insulating film under test at the stress voltage $V_{stress}$, the total injected hole quantity $Q_P$ is obtained. Thereafter, by plotting the total injected hole quantities $Q_P$, obtained for various stress voltages $V_{stress}$, as shown in FIG. 6, for example, the critical injected hole quantity $Q_{Pcrit}$ is obtained.

Also, in obtaining the critical injected electron quantity $Q_{BDcrit}$, a first stress voltage range (e.g., about 6 V or less in the example shown in FIG. 6), in which the total injected electron quantity $Q_{BD}$ is equal to the critical injected electron quantity $Q_{BDcrit}$, is determined.

In the same way, in obtaining the critical injected hole quantity $Q_{Pcrit}$, a second stress voltage range (e.g., about 6 V or more in the example shown in FIG. 6), in which the total injected hole quantity $Q_P$ is equal to the critical injected hole quantity $Q_{Pcrit}$, is determined.

Furthermore, a stress voltage $V_{stress}$, which is located in the boundary between the first and second stress voltage ranges, is also defined as a threshold voltage $V_{Gcrit}$ (e.g., around 6 V in the example illustrated in FIG. 6).

According to the "DCC" model, by obtaining the critical injected electron or hole quantity $Q_{BDcrit}$ or $Q_{Pcrit}$, the lifetime $T_{BD}$ of the gate insulating film (which will be herein called an "insulating film lifetime") can be predicted in a wide stress voltage range. In this case, the insulating film lifetime $T_{BD}$ depends on the stress voltage $V_{stress}$. Thus, in the following description, the insulating film lifetime $T_{BD}$ will be labeled as $T_{BD}(V_{stress})$.

Specifically, where the stress voltage $V_{stress}$ is in the first stress voltage range (i.e., $V_{stress} \leq V_{Gcrit}$), a time it takes for the quantity of electrons injected into the gate insulating film to reach the critical injected electron quantity $Q_{BDcrit}$, i.e., the first provisional lifetime $T_{BDe}$ (which will be herein labeled as "$T_{BDe}(V_{stress})$"), can be regarded as the insulating film lifetime $T_{BD}(V_{stress})$.

In this case, the first provisional lifetime $T_{BDe}(V_{stress})$ is given by $$T_{BDe}(V_{strass})=Q_{BDcrit}/I_G(V_{stress}) \tag{4}$$

where $I_G(V_{stress})$ is an electron current flowing through the gate insulating film at the predetermined stress voltage $V_{stress}$ (see Equation (1)).

On the other hand, where the stress voltage $V_{stress}$ is in the second stress voltage range (i.e., $V_{stress} > V_{Gcrit}$), a time it takes for the quantity of holes injected into the gate insulating film to reach the critical injected hole quantity $Q_{Pcrit}$, i.e., the second provisional lifetime $T_{BDh}$ (which will be herein labeled as "$T_{BDh}(V_{stress})$"), can be regarded as the insulating film lifetime $T_{BD}(V_{stress})$ In this case, the second provisional lifetime $T_{BDh}(V_{stress})$ is given by $$T_{BDh}(V_{stress})=Q_{Pcrit}/I_{sub}(V_{stress}) \tag{5}$$

where $I_{sub}(V_{stress})$ is a hole current flowing through the gate insulating film at the predetermined stress voltage $V_{stress}$ (see Equation (2)).

Also, if the stress voltage $V_{stress}$ is approximately equal to the threshold voltage $V_{Gcrit}$ (i.e., $V_{stress} \approx V_{Gcrit}$), the insulating film lifetime $T_{BD}(V_{stress})$ can be derived, using the first and second provisional lifetimes $T_{BDe}(V_{stress})$ and $T_{BDh}(V_{stress})$, by $$1/T_{BD}(V_{stress}) = 1/T_{BDe}(V_{stress}) + 1/T_{BDh}(V_{stress}) \qquad (6)$$

(see Equation (3)).

As described above, according to the fourth embodiment, the lifetime of a gate insulating film is predicted after the "DCC" model. The "DCC" model is a voltage-lifetime model supposing that if the stress voltage is relatively high, degradation of the gate insulating film due to holes (i.e., the second provisional lifetime $T_{BDh}$) determines the insulating film lifetime $T_{BD}$. This model also supposes that if the stress voltage is relatively low, degradation of the gate insulating film due to electrons (i.e., the first provisional lifetime $T_{BDe}$) determines the insulating film lifetime $T_{BD}$.

That is to say, under the actual operating conditions of a semiconductor device, a total injected electron quantity $Q_{BD}$, which has reached a constant value against a variation in stress voltage applied to the gate insulating film, is obtained in the fourth embodiment as a critical injected electron quantity $Q_{BDcrit}$. The total injected electron quantity $Q_{BD}$ is a total quantity of electrons injected into the gate insulating film before the film causes a dielectric breakdown. Then, the time it takes for the total quantity of electrons, injected into the gate insulating film, to reach the critical injected electron quantity $Q_{BDcrit}$ (i.e., the first provisional lifetime $T_{BDe}$) is estimated as the insulating film lifetime $T_{BD}$.

Thus, compared to the known method (e.g., the "1/E" or "E" model) by which the lifetime is predicted from the critical injected hole quantity $Q_{Pcrit}$ or stress electric field $E_{OX}$, the insulating film lifetime $T_{BD}$ under the actual operating conditions of a semiconductor device can be predicted more accurately. That is to say, the lifetime $T_{BD}$ of an insulating film, in which a weak electric field has been formed, can be predicted more reliably.

Also, according to the fourth embodiment, the insulating film lifetime $T_{BD}$, predicted under the actual operating conditions of the device, is longer than the lifetime predicted by the known "E" model method. Thus, an increased margin is available for the thickness of the gate insulating film or the fabrication process conditions, for example. That is to say, the thickness of the gate insulating film or the fabrication process conditions, which have been non-applicable to the fabrication of semiconductor devices, are now applicable. As a result, the performance of semiconductor devices, like the operating speeds thereof, can be improved.

In the fourth embodiment, the lifetime of a gate insulating film for an n-MOSFET is predicted. However, the insulating film that should have its lifetime predicted is not limited to any particular type.

Embodiment 5

Hereinafter, a lifetime prediction method for an insulating film according to a fifth embodiment of the present invention will be described as being applied to predicting the lifetime of a gate insulating film for an n-MOSFET.

The fifth embodiment is different from the fourth embodiment in that after the critical injected hole quantity $Q_{Pcrit}$ has been obtained, the critical injected electron quantity $Q_{Pcrit}$ is obtained from the quantity $Q_{Pcrit}$ by reference to a correlation between the quantities $Q_{BDcrit}$ and $Q_{Pcrit}$ found when the lifetime of another gate insulating film was predicted, for example.

Specifically, as in the fourth embodiment, by applying a stress voltage $V_{stress}$ to an insulating film under test, a dielectric breakdown time it takes for the insulating film under test to cause a dielectric breakdown is actually measured. Then, using the dielectric breakdown time actually measured and a hole current flowing through the insulating film under test at the stress voltage $V_{stress}$, the total injected hole quantity $Q_P$ is obtained. Thereafter, by plotting the total injected hole quantities $Q_P$, obtained for various stress voltages $V_{stress}$, as shown in FIG. 6, for example, the critical injected hole quantity $Q_{Pcrit}$ is obtained.

In this case, if a correlation between the critical injected electron and hole quantities $Q_{BDcrit}$ and $Q_{Pcrit}$, e.g., $$Q_{BDcrit} = Q_{Pcrit}/\gamma_{crit} \qquad (7)$$

where $\gamma_{crit}$ is a constant (e.g., on the orders of $10^{-4}$ to $10^{-5}$ in the example illustrated in FIG. 6), was found in predicting the lifetime of another gate insulating film, then the critical injected electron quantity $Q_{BDcrit}$ can be derived from the critical injected hole quantity $Q_{Pcrit}$ using this Equation (7), for example.

According to the fifth embodiment, not only the effects of the fourth embodiment but also the following effects are attainable. Specifically, the critical injected electron quantity $Q_{BDcrit}$ can be obtained without calculating the total injected electron quantity $Q_{BD}$. Thus, the insulating film lifetime $T_{BD}(V_{stress})$ can be predicted more easily.

Embodiment 6

Hereinafter, a lifetime prediction method for an insulating film according to a sixth embodiment of the present invention will be described as being applied to predicting the lifetime of a gate insulating film for an n-MOSFET.

The sixth embodiment is different from the fourth or fifth embodiment in that the critical injected hole quantity $Q_{Pcrit}$ is obtained by the "nondestructive lifetime prediction method" described above.

First, as in the first embodiment, a correlation between a stress voltage $V_{stress}$ applied to an insulating film to be tested, having the same specification as a gate insulating film that should have its lifetime predicted, and a polarity change time $T_{Asat}$ is found. The insulating film to be tested and the gate insulating film, of which the lifetime should be predicted, will be herein simply called an "insulating film under test" and a "gate insulating film", respectively. The polarity change time $T_{Asat}$ is a time it takes for the slope of a time dependent variation of an A-mode stress induced leakage current, flowing through the insulating film under test, to start to decline in a double logarithmic plot. In the double logarithmic plot, the coordinate thereof should represent the A-mode stress induced leakage current, while the abscissa thereof a stressing time (see FIG. 2). And a first dielectric breakdown time, i.e., a time it takes for the insulating film under test to cause a dielectric breakdown, is actually measured by applying a first stress voltage to the insulating film under test.

Subsequently, by reference to the correlation between the polarity change time $T_{Asat}$ and the stress voltage $V_{stress}$ and the first dielectric breakdown time, a second dielectric breakdown time is estimated. The second dielectric breakdown time is a time it takes for the gate insulating film to cause a dielectric breakdown when a second stress voltage is applied thereto.

Thereafter, using the second dielectric breakdown time and a hole current flowing through the insulating film under test at the second stress voltage, the total injected hole quantity $Q_P$ is obtained. The critical injected hole quantity $Q_{Pcrit}$, i.e., a total injected hole quantity $Q_P$ that has become constant against a variation in stress voltage $V_{stress}$ applied to the gate insulating film, can be obtained this way. The total injected hole quantity $Q_P$ is a total quantity of holes injected into the gate insulating film before the film causes a dielectric breakdown.

According to the sixth embodiment, not only the effects of the fourth or fifth embodiment, but also the following effects are attainable. Specifically, the total injected hole quantity $Q_P$ can be estimated accurately without actually measuring the dielectric breakdown times of the insulating film under test many times in an accelerated test. As a result, an accurate critical injected hole quantity $Q_{Pcrit}$ can be obtained in a short time.

Embodiment 7

Hereinafter, a lifetime prediction method for an insulating film according to a seventh embodiment of the present invention will be described as being applied to predicting the lifetime of a gate insulating film for an n-MOSFET.

The seventh embodiment is different from the fourth embodiment in that the lifetime of the gate insulating film is predicted using a critical injected electron quantity $Q_{BDcrit}$ obtained when the lifetime of another gate insulating film was predicted.

Specifically, it is believed that the critical injected electron quantity $Q_{BDcrit}$ is variable depending on the film quality or area of a gate insulating film, for example. Accordingly, if a critical injected electron quantity $Q_{BDcrit}$, obtained for an insulating film under test having a different specification (e.g., film quality or area) from the gate insulating film, is used as it is for the lifetime prediction of the gate insulating film, then the lifetime predicted would have an error. However, if the difference in specification between the gate insulating film and the insulating film under test is small, then the critical injected electron quantity $Q_{BDcrit}$ obtained for the insulating film under test may be used as it is for the lifetime prediction of the gate insulating film. In that case, the actual measurement of the dielectric breakdown time or the calculation of the total injected electron quantity $Q_{BD}$ or critical injected electron quantity $Q_{BDcrit}$ may be omitted.

For example, suppose the data shown in FIG. 6 (i.e., $Q_{BDcrit}$=about $10^3$ C/cm$^2$) has been collected from the insulating film under test. In that case, if the specification of the gate insulating film is close to that of the insulating film under test, then the lifetime of the gate insulating film may be predicted while assuming $Q_{BDcrit}$=about $10^3$ C/cm$^2$.

Also, if the area dependence of the critical injected electron quantity $Q_{BDcrit}$ is known, then the critical injected electron quantity $Q_{BDcrit}$ obtained for the insulating film under test may be corrected with the difference in area between the insulating film under test and the gate insulating film taken into account. In this manner, the lifetimes of gate insulating films with various areas may be predicted.

According to the seventh embodiment, not only the effects of the fourth embodiment, but also the following effects are attainable. Specifically, the insulating film lifetime $T_{BD}$ ($V_{stress}$) can be predicted without calculating the total injected electron quantity $Q_{BD}$ or critical injected electron quantity $Q_{BDcrit}$. Thus, the insulating film lifetime $T_{BD}$ ($V_{stress}$) can be predicted easily.

Embodiment 8

Hereinafter, a method for reliability testing of a semiconductor device according to an eighth embodiment of the present invention will be described as being applied to estimating a time it takes for the gate insulating film of an n-MOSFET to cause a dielectric breakdown (i.e., a dielectric breakdown time).

Specifically, the method of the eighth embodiment is a method for testing the reliability of a semiconductor device by utilizing the lifetime prediction method for an insulating film according to the fourth embodiment.

Suppose the dielectric breakdown time of a gate insulating film at a voltage for operating a semiconductor device, (an actual operating voltage) is defined as a time it takes for a total quantity of electrons injected into the gate insulating film to reach the critical injected electron quantity $Q_{BDcrit}$ as in the fourth embodiment. The dielectric breakdown time of the gate insulating film will be herein called an "insulating film lifetime $T_{BD}$". Also, the design or fabrication process of the semiconductor device is supposed to be determined so that the insulating film lifetime $T_{BD}$ is equalized with a desired value (e.g., 10 years). And also suppose that semiconductor devices are actually mass-produced under these conditions.

In general, while a semiconductor device is still being developed, strict lifetime evaluation (or lifetime prediction) is performed. On the other hand, while those devices are being manufactured, routine reliability test or failure diagnosis is carried out on the devices using simple and convenient control indices (or specifications).

In the routine reliability test on a semiconductor device, the gate insulating film of an MOS component under test, included in a sample semiconductor device that was fabricated along with, or separately from, the device be a product, is used. The gate insulating film of the MOS component under test will be herein called an "insulating film under test".

A parameter used as the specification may be an insulating film lifetime $T_{BD}$ where a constant current or voltage stress is imposed on the gate insulating film or a total quantity $Q_{BD}$ of electrons injected into the gate insulating film before the film causes a dielectric breakdown. That parameter will be herein called a "control point".

In the eighth embodiment, first, a total injected electron quantity $Q_{BD}$, which has reached a constant value against a variation in stress voltage applied to the gate insulating film, is obtained as a critical injected electron quantity $Q_{BDcrit}$ The total injected electron quantity $Q_{BD}$ is a total quantity of electrons injected into the gate insulating film before the film causes a dielectric breakdown.

Next, a first time T1 it takes for a total quantity of electrons, injected into the gate insulating film under actual operating conditions of the device, to reach the critical injected electron quantity $Q_{BDcrit}$ (i.e., an insulating film lifetime $T_{BD}$ at the actual operating voltage) is estimated.

Subsequently, if the first time T1 is longer than a predetermined value (e.g., 10 years), a test voltage, higher than the actual operating voltage (which will be herein called an "evaluation voltage") is applied to a first insulating film under test having the same specification as the gate insulating film. In this manner, a second time T2 it takes for the first insulating film under test to cause a dielectric breakdown (i.e., the insulating film lifetime $T_{BD}$ at the evaluation voltage: e.g., 1,000 seconds) is actually measured. Then, a reference control level for a preselected control point of the gate insulating film is determined by the second time T2. In this process step, the second time T2 does not have to be actually measured but may be estimated from the first time T1 by reference to the dependence of the insulating film lifetime $T_{BD}$ on the stress voltage.

Where the insulating film lifetime $T_{BD}$ is used as the control point, the second time T2 may be employed as the reference control level $T_{spec}$ (e.g., 1,000 seconds), for example.

On the other hand, if the total injected electron quantity $Q_{BD}$ is used as the control point, then the total injected electron quantity $Q_{BD}$ at the evaluation voltage may be calculated using the second time T2, i.e., the reference control level $T_{spec}$. Then, the result of calculation may be used as another reference control level $Q_{spec}$ (e.g., 1 C/cm).

Figure 8:
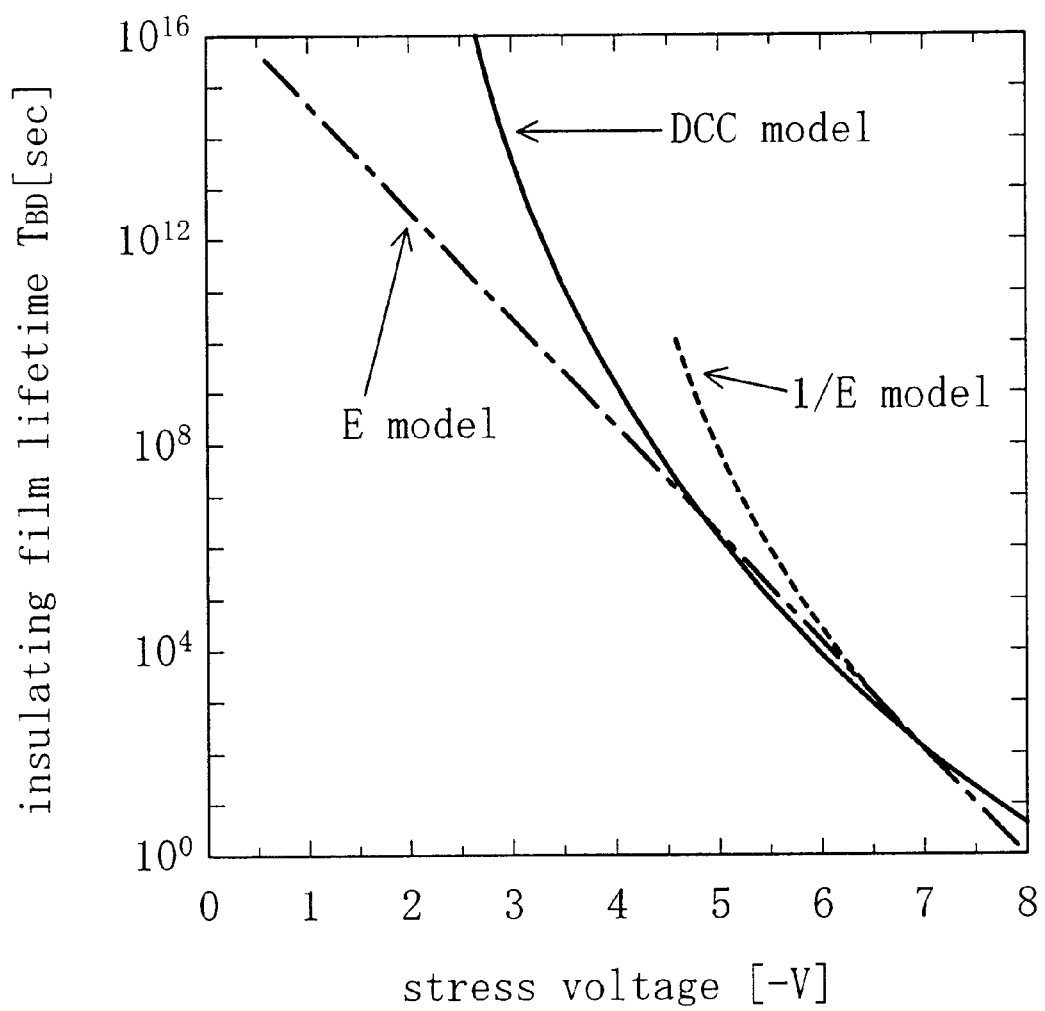
FIG. 8 is a graph illustrating a relationship between the insulating film lifetime, predicted after the "DCC" model, and the stress voltage for use in the second inventive lifetime prediction method.

Next, the evaluation voltage is applied to a second insulating film under test, having the same specification as the gate insulating film, to measure the control point (i.e., the insulating film lifetime $T_{BD}$ or total injected electron quantity $Q_{BD}$) of the second insulating film under test. Then, it is determined whether or not a result of the measurement meets the reference control level $T_{spec}$ or $Q_{spec}$. In this manner, routine reliability testing can be performed on the semiconductor device. The control point of the insulating film under test is measured at the evaluation voltage that is higher than the actual operating voltage. Accordingly, the dielectric breakdown time, i.e., the insulating film lifetime $T_{BD}$, can be estimated in a short time as shown in FIG. 8, for example.

As described above, according to the eighth embodiment, the reliability of a semiconductor device can be tested using a first time T1, i.e., an insulating film lifetime $T_{BD}$ at an actual operating voltage obtained by the lifetime prediction method of the fourth embodiment. Accordingly, compared to the known method (e.g., the "1/E" or "E" model) by which the lifetime is predicted using the critical injected hole quantity $Q_{Pcrit}$ or stress electric field $E_{OX}$ the insulating film lifetime $T_{BD}$ can be predicted more reliably. As a result, the reliability of the semiconductor device can be tested more appropriately.

In the eighth embodiment, the reference control level is determined by the insulating film lifetime $T_{BD}$ (i.e., the first time T1) obtained by the lifetime prediction method of the fourth embodiment at the actual operating voltage. Alternatively, a reference control level may be determined in view of the shape or size of an MOS component under test or the conditions (e.g., temperature, voltage or current) under which the control point was measured. Or the reference control level may also be determined by the control point actually measured for a real fabricated semiconductor device or a device under test. Next, another reference control level may be determined by the first time T1. And then it may be determined according to the latter reference control level whether or not the former reference control level is appropriate.

In the eighth embodiment, a dielectric breakdown time is estimated for the gate insulating film of an n-MOSFET. However, the insulating film that should have its dielectric breakdown time estimated is not limited to any particular type.

Also, in the eighth embodiment, the control point is not limited to any particular one, either.

What is claimed is:

1. A method for predicting the lifetime of an insulating film for use in a semiconductor device, in which a time it takes for the insulating film to cause a dielectric breakdown is estimated as an expected lifetime of the insulating film, characterized by comprising the steps of:

finding a correlation between a stress condition imposed on the insulating film and a time it takes for the slope of a time dependent variation of an A-mode stress induced leakage current to start to decline in a double logarithmic plot or a correlation between the stress condition and a time it takes for an FN current to start to decrease, the A-mode stress induced leakage current and the FN current both flowing through the insulating film;

actually measuring a first dielectric breakdown time it takes for the insulating film to cause the dielectric breakdown with a first stress condition imposed on the insulating film; and estimating, from the correlation and the first dielectric breakdown time, a second dielectric breakdown time it takes for the insulating film, on which a second stress condition is imposed, to cause the dielectric breakdown.

2. The method of claim 1, characterized in that the stress condition is a stress voltage or a stress electric field.

3. The method of claim 1, characterized in that the thickness of the insulating film is 10 nm or less.

4. The method of claim 1, characterized in that the insulating film is a gate insulating film for an MOS device.

5. A method for predicting the lifetime of an insulating film for use in a semiconductor device, in which a time it takes for the insulating film to cause a dielectric breakdown is estimated as an expected lifetime of the insulating film, characterized by comprising:

a first step of obtaining, as a critical injected electron quantity, a total injected electron quantity that has reached a constant value against a variation in stress voltage applied to the insulating film, the total injected electron quantity being a total quantity of electrons injected into the insulating film before the film causes the breakdown; and a second step of estimating, as the expected lifetime of the insulating film, a time it should take for a total quantity of electrons, injected into the insulating film under predetermined stress, to reach the critical injected electron quantity.

6. The method of claim 5, characterized in that the first step comprises the steps of:

actually measuring a dielectric breakdown time it takes for the insulating film, to cause the dielectric breakdown by applying a stress voltage to the insulating film; and then obtaining the total injected electron quantity using the dielectric breakdown time actually measured and an electron current flowing through the insulating film when the stress voltage is applied thereto.

7. The method of claim 5, characterized in that the second step comprises the step of deriving the expected lifetime of the insulating film by $$T_{BD} = Q_{BDcrit}/I_e$$

where $T_{BD}$ is the lifetime of the insulating film, $Q_{BDcrit}$ is the critical injected electron quantity and $I_e$ is the amount of the electron current flowing through the insulating film under the predetermined stress.

8. The method of claim 5, characterized in that the first step comprises the steps of:

obtaining, as a critical injected hole quantity, a total injected hole quantity that has reached a constant value against the variation in stress voltage applied to the insulating film, the total injected hole quantity being a total quantity of holes injected into the insulating film before the film causes the breakdown; and then deriving the critical injected electron quantity from the critical injected hole quantity.

9. The method of claim 8, characterized in that the step of obtaining the critical injected hole quantity in the first step comprises the steps of:
   actually measuring a dielectric breakdown time it takes for the insulating film, to cause the dielectric breakdown by applying a stress voltage to the insulating film; and then
   deriving the total injected hole quantity from the dielectric breakdown time actually measured and a hole current flowing through the insulating film when the stress voltage is applied thereto.

10. The method of claim 8, characterized in that the step of obtaining the critical injected hole quantity in the first step comprises the steps of:
   finding a correlation between a stress voltage applied to the insulating film and a time it takes for the slope of a time dependent variation of an A-mode stress induced leakage current to start to decline in a double logarithmic plot, the A-mode stress induced leakage current flowing through the insulating film;
   actually measuring a first dielectric breakdown time it takes for the insulating film to cause the dielectric breakdown with a first stress voltage applied to the insulating film;
   estimating, from the correlation and the first dielectric breakdown time, a second dielectric breakdown time it takes for the insulating film, to which a second stress voltage is applied, to cause the dielectric breakdown; and
   deriving the total injected hole quantity from the second dielectric breakdown time and a hole current flowing through the insulating film when the second stress voltage is applied thereto.

11. The method of claim 5, characterized in that the lifetime of the insulating film, which is estimated in the second step, is regarded as a first provisional lifetime, and also characterized by further comprising:
   a third step of obtaining, as a critical injected hole quantity, a total injected hole quantity that has reached a constant value against the variation in stress voltage applied to the insulating film, the total injected hole quantity being a total quantity of holes injected into the insulating film before the film causes the breakdown;
   a fourth step of estimating, as a second provisional lifetime of the insulating film, a time it takes for a total quantity of holes, injected into the insulating film under the predetermined stress, to reach the critical injected hole quantity; and
   a fifth step of predicting the lifetime of the insulating film from the first and second provisional lifetimes.

12. The method of claim 11, characterized in that the third step comprises the steps of:
   actually measuring a dielectric breakdown time it takes for the insulating film, to cause the dielectric breakdown by applying a stress voltage to the insulating film; and then
   deriving the total injected hole quantity from the dielectric breakdown time actually measured and a hole current flowing through the insulating film when the stress voltage is applied thereto.

13. The method of claim 11, characterized in that the third step comprises the steps of:
   finding a correlation between a stress voltage applied to the insulating film and a time it takes for the slope of a time dependent variation of an A-mode stress induced leakage current to start to decline in a double logarithmic plot, the A-mode stress induced leakage current flowing through the insulating film;
   actually measuring a first dielectric breakdown time it takes for the insulating film to cause the dielectric breakdown with a first stress voltage applied to the insulating film;
   estimating, from the correlation and the first dielectric breakdown time, a second dielectric breakdown time it takes for the insulating film, to which a second stress voltage is applied, to cause the dielectric breakdown; and
   deriving the total injected hole quantity from the second dielectric breakdown time and a hole current flowing through the insulating film when the second stress voltage is applied thereto.

14. The method of claim 11, characterized in that the fourth step comprises the step of obtaining the second provisional lifetime by $$T_{BDh} = Q_{Pcrit}/I_h$$

where $T_{BDh}$ is the second provisional lifetime, $Q_{Pcrit}$ is the critical injected hole quantity and $I_h$ is the amount of the hole current flowing through the insulating film under the predetermined stress.

15. The method of claim 11, characterized in that the fifth step comprises the step of predicting the lifetime of the insulating film by $$1/T_{BD} = 1/T_{BDe} + 1/T_{BDh}$$

where $T_{BD}$ is the lifetime of the insulating film, $T_{BDe}$ is the first provisional lifetime and $T_{BDh}$ is the second provisional lifetime.

16. A method of testing the reliability of a semiconductor device by estimating a time it takes for an insulating film for use in the device to cause a dielectric breakdown, characterized by comprising:
   a first step of obtaining, as a critical injected electron quantity, a total injected electron quantity that has reached a constant value against a variation in stress voltage applied to the insulating film, the total injected electron quantity being a total quantity of electrons injected into the insulating film before the film causes the breakdown;
   a second step of estimating a first time it takes for a total quantity of electrons, injected into the insulating film under actual operating conditions of the device, to reach the critical injected electron quantity;
   if the first time is equal to or greater than a predetermined value, a third step of estimating a second time it takes for the insulating film, to cause the dielectric breakdown by applying a test voltage, higher than a voltage applied to the insulating film under the actual operating conditions of the device, to the insulating film, and then determining, by the second time, a reference control level for a preselected control point of the insulating film; and
   a fourth step of applying the test voltage to, which also has the same specification as the insulating film, to measure the preselected control point of the insulating film, and then determining whether or not a result of the measurement meets the reference control level.

* * * * *